(12) United States Patent
Tanimoto et al.

(10) Patent No.: US 8,722,497 B2
(45) Date of Patent: May 13, 2014

(54) SILICON CARBIDE SEMICONDUCTOR DEVICE AND METHOD FOR PRODUCING THE SAME

(71) Applicants: Nissan Motor Co., Ltd., Kanagawa (JP); Rohm Co., Ltd., Kyoto (JP)

(72) Inventors: Satoshi Tanimoto, Yokohama (JP); Noriaki Kawamoto, Kyoto (JP); Takayuki Kitou, Kameoka (JP); Mineo Miura, Kyoto (JP)

(73) Assignees: Nissan Motor Co., Ltd., Kanagawa-Ken (JP); Rohm Co., Ltd., Kyoto-Fu (JP)

( * ) Notice: Subject to any disclaimer, the term of this patent is extended or adjusted under 35 U.S.C. 154(b) by 0 days.

(21) Appl. No.: 13/953,704

(22) Filed: Jul. 29, 2013

(65) Prior Publication Data

US 2013/0309877 A1 Nov. 21, 2013

Related U.S. Application Data

(62) Division of application No. 13/299,136, filed on Nov. 17, 2011, now Pat. No. 8,497,218, which is a division of application No. 11/991,249, filed as application No. PCT/JP2006/316795 on Aug. 22, 2006, now Pat. No. 8,222,648.

(30) Foreign Application Priority Data

Aug. 29, 2005 (JP) .................................. 2005-247175

(51) Int. Cl.
*H01L 29/24* (2006.01)
(52) U.S. Cl.
USPC ........... 438/286; 438/763; 257/409; 257/682; 257/637; 257/E29.104; 257/E21.285

(58) Field of Classification Search
USPC ................ 438/286, 763; 257/77, 409, 637, 257/E29.104, E21.285
See application file for complete search history.

(56) References Cited

U.S. PATENT DOCUMENTS

| 5,972,801 | A | 10/1999 | Lipkin et al. |
| 6,097,453 | A | 8/2000 | Okita |

(Continued)

FOREIGN PATENT DOCUMENTS

| EP | 0697716 A2 | 2/1996 |
| JP | 11-505073 A | 5/1999 |

(Continued)

OTHER PUBLICATIONS

Japanese Office Action issued in Japanese Application No. 2012-063091 dated Sep. 3, 2013 with English Translation.

(Continued)

*Primary Examiner* — Marc Armand
(74) *Attorney, Agent, or Firm* — McDermott Will & Emery LLP

(57) ABSTRACT

A silicon carbide semiconductor device (90), includes: 1) a silicon carbide substrate (1); 2) a gate electrode (7) made of polycrystalline silicon; and 3) an ONO insulating film (9) sandwiched between the silicon carbide substrate (1) and the gate electrode (7) to thereby form a gate structure, the ONO insulating film (9) including the followings formed sequentially from the silicon carbide substrate (1): a) a first oxide silicon film (O) (10), b) an SiN film (N) (11), and c) an SiN thermally-oxidized film (O) (12, 12*a*, 12*b*). Nitrogen is included in at least one of the following places: i) in the first oxide silicon film (O) (10) and in a vicinity of the silicon carbide substrate (1), and ii) in an interface between the silicon carbide substrate (1) and the first oxide silicon film (O) (10).

5 Claims, 16 Drawing Sheets

(56) References Cited

U.S. PATENT DOCUMENTS

| | | | |
|---|---|---|---|
| 6,362,051 | B1 | 3/2002 | Yang et al. |
| 6,455,892 | B1 | 9/2002 | Okuno et al. |
| 6,833,562 | B2 | 12/2004 | Tanimoto et al. |
| 2002/0153594 | A1* | 10/2002 | Lipkin et al. .................. 257/637 |
| 2003/0107041 | A1 | 6/2003 | Tanimoto et al. |
| 2003/0203572 | A1 | 10/2003 | Yoshino |
| 2005/0040479 | A1 | 2/2005 | Koldiaev et al. |
| 2005/0247986 | A1* | 11/2005 | Ko et al. ...................... 257/411 |
| 2005/0272198 | A1 | 12/2005 | Hamamura et al. |
| 2006/0027833 | A1 | 2/2006 | Tanimoto |

FOREIGN PATENT DOCUMENTS

| | | |
|---|---|---|
| JP | 2002-222950 A | 8/2002 |
| JP | 2003-031808 A | 1/2003 |
| JP | 2003-243653 A | 8/2003 |
| JP | 2003-243654 A | 8/2003 |
| JP | 2004-537847 A | 12/2004 |
| JP | 2005-019951 A | 1/2005 |
| WO | 97/17730 A1 | 5/1997 |
| WO | 02/101767 A2 | 12/2002 |
| WO | 2004/097926 A1 | 11/2004 |

OTHER PUBLICATIONS

Japanese Office Action, with English Translation, issued in Japanese Patent Application No. 2005-247175, dated Dec. 20, 2011.

Notice of Allowance issued in U.S. Appl. No. 11/991,249 dated Jan. 24, 2012.

Taiwanese Office Action and Search Report, w/ English translation thereof, issued in Taiwanese Patent Application No. 95131754 dated on Oct. 28, 2008.

Japanese Notification of Reasons for Refusal, w/ English translation thereof, issued in Japanese Patent Application No. JP 2005-247175 dated Oct. 4, 2011.

Tanimoto, S., et al., "High-reliability ONO Gate Dielectric for Power MOSFETs," Material Science Forum, 2005, p. 677-680, vol. 483-485, XP008071439, Trans Tech Publications.

Lipkin, L., et al., "Challenges and State-of-the-Art of Oxides on SiC," Materials Research Society Symposium Proceedings, Nov. 27, 2000, p. H3.1.1-H3.1.10, vol. 640, Materials Research Society.

Jamet, P., et al., "Effects of nitridation in gate oxides grown on 4H-SiC," Journal of Applied Physics, Nov. 15, 2001, p. 5058-5063, vol. 90, No. 10, American Institute of Physics.

Extended Abstracts (The 51st Spring Meeting, Tokyo University of Technology, 2004); The Japan Society of Applied Physics and Related Societies, p. 434, Lecture No. 29p-ZM-5.

Lipkin, L.A., et al., "Insulator Investigaton on SiC for Improved Reliability," IEEE Transactions on Electronic Devices, Mar. 1999, p. 525-530, vol. 46, No. 3, IEEE.

Wang, X. W., et al., "High-Temperature Characteristics of High-Quality SiC MIS Capacitors with O/N/O Gate Dielectric," IEEE Transactions on Electronic Devices, Feb. 2000, p. 458-463, vol. 47, No. 2, IEEE.

Tanimoto, S., et al., "Gate Oxide with High Dielectric Breakdown Strength after Undergoing a Typical Power Mosfet Fabrication Process," Materials Science Forum, 2003, p. 725-728. vols. 433-436, Trans Tech Publications, Switzerland.

Tanimoto, S., et al., "High-reliability ONO Gate Dielectric for Power MOSFETs," Materials Science Forum, 2005, p. 677-680, vol. 483-485, Trans Tech Publications, Switzerland.

* cited by examiner (a)

(b)

(c)

(f)

(g)

SILICON CARBIDE SEMICONDUCTOR DEVICE AND METHOD FOR PRODUCING THE SAME

RELATED APPLICATIONS

This application is a Divisional of U.S. application Ser. No. 13/299,136, filed on Nov. 17, 2011, which is a Divisional of U.S. application Ser. No. 11/991,249, filed on Feb. 29, 2008, now U.S. Pat. No. 8,222,648, which is the U.S. National Phase under 35 U.S.C. §371 of International Application No. PCT/JP2006/316795, filed on Aug. 22, 2006, which in turn claims the benefit of Japanese Application No. 2005-247175, filed on Aug. 29, 2005, the disclosures of which Applications are incorporated by reference herein.

TECHNICAL FIELD

The present invention relates to a silicon carbide semiconductor device having a metal-insulator-semiconductor (MIS) structure with high reliability and also relates to a method for producing the same.

BACKGROUND ART

In terms of a power device, between an on resistance and a reverse blocking voltage, there is a trade off relation which is specified, in principle, by a forbidden band gap. Therefore, in the current Si power device, obtaining high performance beyond the theoretical limit determined by the forbidden band of Si is of difficulty. However, making the power device by a semiconductor material having a wide forbidden band gap can greatly relieve the conventional trade off relation, thereby realizing a device which is remarkably improved in at least one of the on resistance and the reverse blocking voltage.

With the temperature so increased as to boomingly generate a electron-positive hole pair by thermal excitation, a semiconductor is unable to distinguish p type area from n type area or to control carrier density, making it difficult to operate the device. In the case of an Si semiconductor having a forbidden band gap of 1.12 eV, generation of the electron-positive hole pairwise is intensified from around 500 K (=227° C.), therefore, a practical upper limit temperature as a semiconductor device is 180° C. on the premise of a continuous operation. Making a semiconductor device (not limited to a power device) using a wide forbidden band material will greatly increase an operating temperature area (for example, more than or equal to 300° C.), greatly widening application of the semiconductor device.

The silicon carbide (hereinafter denoted "SiC") semiconductor under the present invention is one of the wide forbidden band semiconductor materials capable of improving performance. Recently, with the development of single crystal substrate, a wafer (3C, 6H, 4H) featuring a comparatively good quality and having a diameter of more than or equal to three inches is commercially available. SiC has a forbidden band gap, specifically, 3C crystal system having 2.23 eV, 6H crystal system having 2.93 eV, and 4H crystal system having 3.26 eV, each sufficiently wider than those of Si. Compared with other wide forbidden band semiconductors, SiC is chemically stable extremely and mechanically rigid. With the SiC semiconductor, forming of pn junction, controlling of impurity density and selectively forming of impurity area are possible in a method like that for producing Si semiconductor.

In addition, SiC is especially outstanding over other wide forbidden band semiconductors. Specifically, like Si, SiC is a unique semiconductor capable of generating oxide silicon ($SiO_2$) by thermal oxidizing, which is an advantage. With this, it is expected that a normally-off type MOS drive device, for example, a power MOSFET (Metal-Oxide-Semiconductor Field Effect Transistor) or power IGBT (Insulated Gate Bipolar Transistor) can be realized by the SiC, making various companies vigorously develop the SiC.

Realizing the MOS drive SiC device, however, may cause various problems. Among other things, a drastic improvement in reliability of gate oxide film is the greatest issue. Primarily, an SiC thermally-oxidized film has the following features: (1) an energy barrier against a conductive electron of $SiO_2$/SiC interface is, in principle, smaller than that of an Si thermally-oxidized film, and (2) a considerable amount of C (carbon) as a remnant is included in $SiO_2$. Thus, it was expected that the SiC thermally-oxidized film, in principle, causes more leak current than the Si thermally-oxidized film and finds difficulty in bringing about as high reliability (root cause) as that brought about by the Si thermally-oxidized film. However, reliability of an actual SiC thermally-oxidized film is below the above expectation, causing further deterioration.

Reasons therefor are to be explained. The Si device is known for that an Si thermally-oxidized film formed by thermally oxidizing a substrate having a surface with crystal imperfection (dislocation and the like) causes an insulation breakdown in a low electric field or is remarkably decreased in time dependent dielectric breakdown (TDDB) lifetime. The SiC thermally-oxidized film may cause the like effect. In "Tanimoto et al., Extended Abstracts (The 51st Spring Meeting, Tokyo University of Technology, 2004); The Japan Society of Applied Physics and Related Societies, p. 434, Lecture No. 29p-ZM-5 (hereinafter referred to as "non-patent document 1")", the present inventors (Satoshi Tanimoto is the present inventor) reported the following: TDDB lifetime of a gate oxide film of a power MOSFET having a practical area depends on defect attributable to a great amount of dislocations on the surface of the SiC substrate used. As a result, compared with the Si thermally-oxidized film (having no same defect), the SiC thermally-oxidized film has TDDB lifetime decreased by more than or equal to two-digit.

Use of a layered (gate) insulating film may solve the above reliability problems of the SiC thermally-oxidized film, although not so much reports have been made thereon. Among the above, an ONO gate insulating film is the most desirable and practical. In "ONO", "O" denotes $SiO_2$ film (oxide silicon film) and "N" denotes $Si_3N_4$ film (silicon nitride film. Otherwise, denoted "SiN film" for short).

In "IEEE Transactions on Electron Devices, Vol. 46, (1999). p. 525" (hereinafter referred to as "non-patent document 2"), L. A. Lipkin et al. studied reliability of a metal-insulator-semiconductor (MIS) structure of a gate electrode having the following structure:

Between i) an $n^+$ type 4H—SiC substrate (having a surface where an $n^-$ type epitaxial layer is grown) and ii) a Mo/Au gate electrode, an ONO gate insulating film is sandwiched which includes:
  1) SiC thermally-oxidized film,
  2) an SiN film produced by an LPCVD (Low Pressure Chemical Vapor Deposition), and
  3) an $SiO_2$ film formed by thermally oxidizing the surface of the above SiN film in 2).

The study by L. A. Lipkin et al. has obtained a maximum insulation breakdown strength BEox=about 13.1 MV/cm ($SiO_2$ converted), and a maximum stress current strength BJox=about 0.25 mA/cm².

Herein, the superscript "+" and the superscript "−" on "n" or "p" each denoting conductivity (negative or positive) of the semiconductor denote, respectively, high density and low density.

Meanwhile, X. W. Wang et al., in "IEEE Transactions on Electron Devices, Vol. 47, (2000) p. 458" (hereinafter referred to as "non-patent document 3") discloses an evaluation on reliability of an MIS structure where an ONO gate insulating film formed by thermal oxidizing of a surface of $SiO_2$/SiN films layered by a JVD (jet vapor deposition) is sandwiched between a 6H—SiC substrate and an Al gate electrode, to thereby obtain BEox=about 12.5 MV/cm ($SiO_2$ converted) and BJox=3 mA/cm$^2$.

However, the above two ONO gate insulating films according to the non-patent document 2 and the non-patent document 3 each are less reliable than the SiC thermally-oxidized film. Actually, in "Material Science Forum, Vols. 433-436, (2003) p. 725" (hereinafter referred to as "non-patent document 4"), the present inventors Satoshi Tanimoto et al. report an accomplishment of BEox=13.2 MV/cm and BJox>100 mA/cm$^2$ by using a MOS structure including a thermally-oxidized film of 4H—SiC substrate. As obvious by comparison with the result of the non-patent document 4, the above two ONO gate insulating films according to the non-patent document 2 and the non-patent document 3 are less reliable than the SiC thermally-oxidized film obtained by the present inventors in terms of BEox and BJox.

Under the above background, recognizing potentiality of the ONO gate insulating film, the present inventors studied a method for applying the ONO gate insulating film to a structure or production processes of an actual power MOS device. By the following operations, the present inventors successfully accomplished BEox=21 MV/cm and BJox>10A/cm$^2$ which are far better in performance than those of the above two ONO gate insulating films according to the non-patent documents 2 and 3 and the conventional SiC thermally-oxidized film in the non-patent document 1:

1) Between a polycrystalline silicon gate electrode and an SiC substrate, sandwiching the ONO insulating film where i) an SiC thermally-oxidized film ii) CVD silicon nitride film and iii) a thermally-oxidized film of the CVD silicon nitride film in ii) are sequentially layered.

2) Providing the polycrystalline silicon thermally-oxidized film and the silicon nitride sideface thermally-oxidized film, respectively, on a sideface of the gate electrode and a sideface of the silicon nitride film.

Refer to "Satoshi Tanimoto et al., Material Science Forum, Vols. 483-485, (2005) p. 677", hereinafter referred to as "non-patent document 5". This ONO insulating film structure has TDDB lifetime (=charge quantity passing per unit area until insulation breakdown) of $Q_{BD}$=about 30 C/cm$^2$ which is at least two-digit higher than that of the SiC thermally-oxidized film, and is substantially equivalent to that of a thermally-oxidized film on a non-defect single crystal Si substrate.

DISCLOSURE OF THE INVENTION

According to the conventional technology (non-patent document 5), the TDDB lifetime of the ONO gate insulating film is greatly improved to such an extent as to reach that of the Si thermally-oxidized film, but the ONO gate insulating film is not necessarily sufficient for a long time operation at a temperature higher than a practical upper limit temperature of the Si (MOS) device, therefore requiring further improvement in TDDB lifetime.

It is an object of the present invention to provide a silicon carbide semiconductor device with an improved practical upper limit temperature, and a method for producing the same.

According to a first aspect of the present invention, there is provided a silicon carbide semiconductor device, comprising: 1) a silicon carbide substrate; 2) a gate electrode made of polycrystalline silicon; and 3) an ONO insulating film sandwiched between the silicon carbide substrate and the gate electrode to thereby form a gate structure, the ONO insulating film including the followings formed sequentially from the silicon carbide substrate: a) a first oxide silicon film (O), b) an SiN film (N), and c) an SiN thermally-oxidized film (O), wherein nitrogen is included in at least one of the following places: i) in the first oxide silicon film (O) and in a vicinity of the silicon carbide substrate, and ii) in an interface between the silicon carbide substrate and the first oxide silicon film (O).

According to a second aspect of the present invention, there is provided a method for producing the silicon carbide semiconductor device according to the first aspect, wherein the first oxide silicon film (O) is formed by a heat treatment in an oxidized nitrogen (NOx) gas atmosphere in a period after forming of a precursor oxide silicon film and before depositing of the SiN film (N).

According to a third aspect of the present invention, there is provided a method for producing the silicon carbide semiconductor device according to the first aspect, wherein the first oxide silicon film (O) is formed by a reoxidization in an oxidized nitrogen (NOx) gas atmosphere in a period after forming of a precursor oxide silicon film and before depositing of the SiN film (N).

According to a fourth aspect of the present invention, there is provided a method for producing the silicon carbide semiconductor device according to the first aspect, wherein the first oxide silicon film (O) is formed by thermally oxidizing a surface of the silicon carbide substrate in an oxidized nitrogen (NOx) gas atmosphere.

According to a fifth aspect of the present invention, there is provided a method for producing the silicon carbide semiconductor device according to the first aspect, wherein the first oxide silicon film (O) is formed by the following sequential operations: 1) forming a thin oxide silicon film by one of the following sub-operations: i) a heat treatment in an oxidized nitrogen (NOx) gas atmosphere in a period after forming of a precursor oxide silicon film and before depositing of the SiN film (N), ii) a reoxidization in the oxidized nitrogen (NOx) gas atmosphere in the period after forming of the precursor oxide silicon film and before depositing of the SiN film (N), and iii) thermally oxidizing a surface of the silicon carbide substrate in the oxidized nitrogen (NOx) gas atmosphere, and 2) depositing, on the thin oxide silicon film, another oxide silicon film which is formed by an operation other than the thermal oxidizing.

The other features, advantages and benefits of the present invention will become apparent from the following description in conjunction with the following drawings.

BEST MODE FOR CARRYING OUT THE INVENTION

Figure 1:
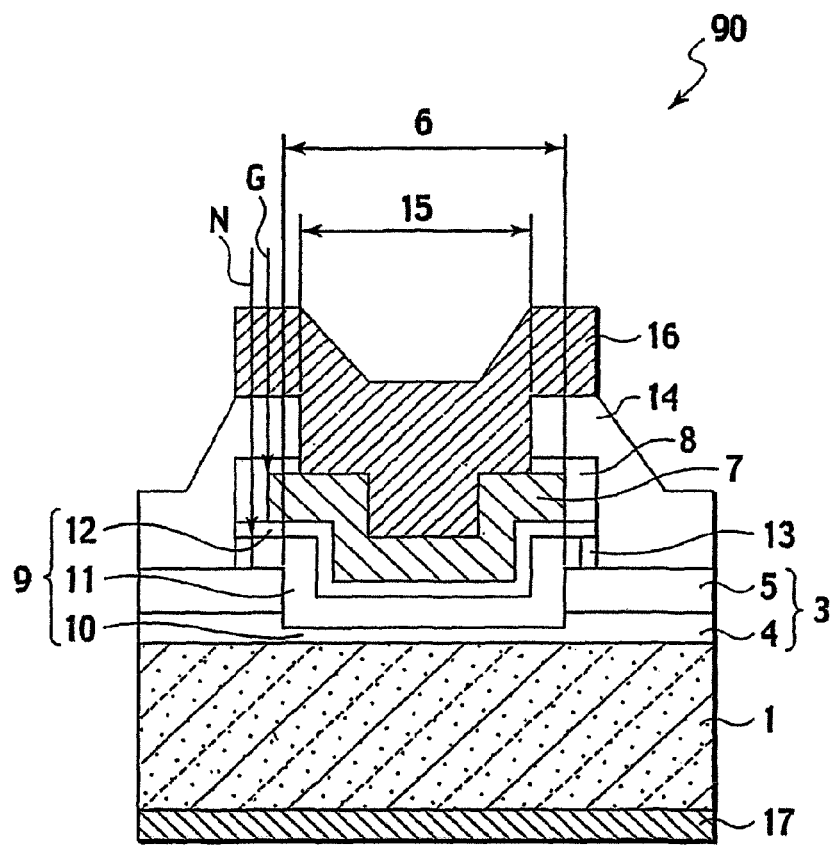
FIG. 1 is a cross sectional view of essential parts of a semiconductor device, according to the first embodiment of the present invention.
Figure 2:
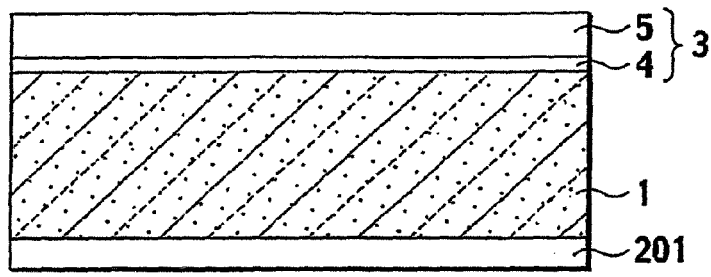
FIG. 2 is a cross sectional view of the production operation of the semiconductor device, according to the first embodiment of the present invention.
Figure 2:
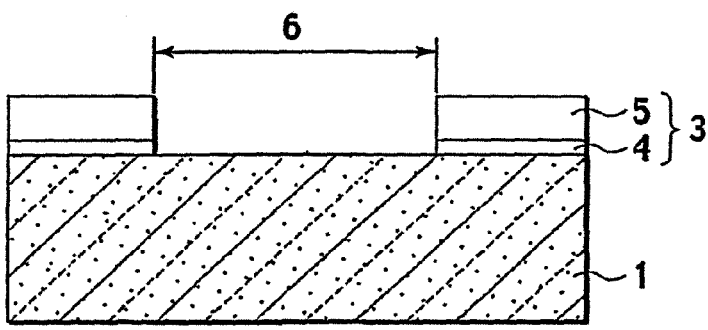
Figure 2:
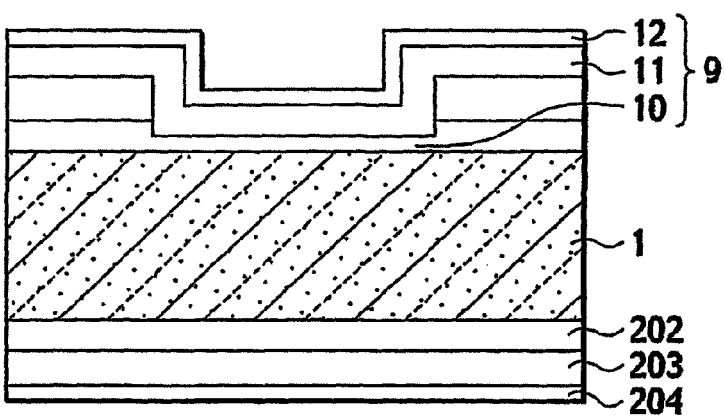

Hereinafter, referring to the drawings, various embodiments of the present invention are to be set forth in detail. Unless otherwise specified, the term "substrate" is an SiC substrate on which any of an epitaxial layer, other film and other electrode is formed.

In the following drawings, the same or similar parts are to be denoted by the same or similar reference numerals or signs, and the description thereof is, as the case may be, simplified or omitted. The drawings are schematic, and therefore i) thickness relative to plan-view dimension or ii) thickness ratio and the like of each layer is, as the case may be, not actual. Therefore, specific thickness or dimension should be determined referring to the following explanation. Moreover, relative dimension or ratio between the drawings is, as the case may be, not actual.
<<First Embodiment>>
<Structure>

FIG. 1 is a cross sectional view of an essential part of a silicon carbide semiconductor device 90 having an MIS structure (capacitor) including a high-reliability ONO layered film, according to a first embodiment of the present invention, where MIS denotes Metal-Insulator-Semiconductor.

In FIG. 1, there is provided an $n^+$ type 4H—SiC epitaxial substrate 1 having a high impurity density (nitrogen>$1\times10^{19}$/$cm^3$). On an upper surface of the $n^+$ type 4H—SiC epitaxial substrate 1, an $n^-$ type epitaxial layer is grown homo-epitaxially. Substrates having other structural systems such as 6H, 3C and 15R can be used, where H denotes hexagonal system, C denotes cubic system and R denotes flicytalhohedral system.

Moreover, substrates having the following structures can be used:
  i) p type epitaxial layer or p type SiC substrate, or
  ii) p type or n type epitaxial layer grown on semi-insulating SiC substrate.

On the SiC epitaxial substrate 1, there is disposed a field insulating film 3 having a thickness of more than or equal to several 100 nm.

The field insulating film 3 includes i) a thin lower insulating film 4 formed by thermally-oxidizing the SiC substrate (technically, epitaxial layer) and ii) a thick upper insulating film 5 formed by an operation (for example, LPCVD [Low Pressure Chemical Vapor Deposition] and the like) other than the thermal oxidizing of the SiC substrate and layered on the lower insulating film 4. The field insulating film 3 is formed with a gate window 6 which is open.

A gate electrode 7 made of polycrystalline Si is provided in such a manner as to cover the gate window 6. At least a sideface of the polycrystalline Si gate electrode 7, there is formed a polycrystalline Si thermally-oxidized film 8 grown by thermal oxidizing. Between the SiC epitaxial substrate 1 (base of the gate window 6) and the gate electrode 7, an ONO gate insulating film 9 having a 3-layer structure is sandwiched. Between the SiC epitaxial substrate 1 and the polycrystalline Si gate electrode 7, the ONO gate insulating film 9 includes: i) a first oxide silicon film 10 (O), ii) an SiN film 11 (N) and iii) an SiN thermally-oxidized film 12 (O: second oxide silicon film), which are arranged sequentially from the SiC epitaxial substrate 1. The semiconductor device 90 has a gate structure sandwiching the ONO gate insulating film 9.

The lowermost part (SiC epitaxial substrate 1 side) of the 3-layer structure of the ONO gate insulating film 9, namely, the first oxide silicon film 10 includes N (nitrogen) in at least one of the following places: i) in an interface between the first oxide silicon film 10 and the SiC epitaxial substrate 1 and ii) in the vicinity of the interface. The first oxide silicon film 10 is localized around an area of the gate window 6. The oxide silicon film 10 has a thickness from 3.5 nm to 25 nm, especially, thickness from 4 nm to 10 nm giving an extremely preferable result.

The oxide silicon film 10 is formed by the following sequential operations:
  i) thermally-oxidizing the surface of the SiC epitaxial substrate 1, and
  ii) heat treatment or reoxidization in an oxidized nitrogen (NOx) gas atmosphere.

For forming the oxide silicon film 10, otherwise, the surface of the SiC epitaxial substrate 1 may be thermally oxidized directly by the oxidized nitrogen gas (NOx).

In case the SiC thermally-oxidized film cannot be used due to structural restriction of the semiconductor device 90, the oxide silicon film 10 may be formed by the following operation: an $SiO_2$ film deposited by chemical vapor deposition (CVD) is subjected to the heat treatment or reoxidization in the oxidized nitrogen (NOx) gas atmosphere.

Of the 3-layer structure of the ONO gate insulating film 9, the SiN film 11 is an intermediate layer (=N) deposited by LPCVD and the like, and the SiN thermally-oxidized film 12 (namely, SiO$_2$ film) grown by oxidizing the surface of the SiN film 11 is an uppermost layer (=O). The SiN film 11 and the SiN thermally-oxidized film 12 are formed to extend on the field insulating film 3. The SiN film 11 and the SiN thermally-oxidized film 12 have thickness, for example, 53 nm and 5 nm respectively. On an outer edge sideface of the SiN film 11, there is disposed a thin SiN sideface thermally-oxidized film 13 (namely, SiO$_2$ film) grown by thermally-oxidizing the SiN film 11. When viewed on a plan, the polycrystalline Si gate electrode 7 has an outer edge G disposed inside an outer edge N of the SiN film 11.

On the gate electrode 7 and the field insulating film 3, an interlayer dielectric film 14 (for short, otherwise referred to as "ILD film 14") is formed. A gate contact window 15 is so open in the ILD film 14 as to pass through the gate electrode 7. Instead of being in the gate window 6 as shown in FIG. 1, the gate contact window 15 may have such a structure as to be disposed on the gate electrode 7 extending on the field insulating film 3. Via the gate contact window 15, an inner wiring 16 connects the gate electrode 7 to other circuit element(s) on the same substrate or to an outer circuit.

On a backface of the SiC epitaxial substrate 1, there is disposed an ohmic contact electrode 17 having an extremely low resistance. The ohmic contact electrode 17 is formed by the following sequential operations: i) a contact metal such as Ni is vacuum deposited on a back of the SiC epitaxial substrate 1, ii) alloying the thus obtained with SiC by a rapid heat treatment at a temperature lower than the thermal oxidizing temperature for the oxide silicon film 10 (namely, SiC thermally-oxidized film) of the ONO gate insulating film 9, for example, 1000° C. relative to the thermal oxidizing at 1100° C.

<Production Method>

Then, referring to FIG. 2(a) to FIG. 6(i), a method for producing the MIS structure (see FIG. 1) including the ONO gate insulating film 9 is to be explained, according to the first embodiment of the present invention.

Operation (a): A (0001) Si face 8° off cut n$^+$ type 4H-SiC epitaxial substrate 1 having an upper surface where a high-quality n$^-$ type epitaxial layer is grown is sufficiently cleaned by an RCA cleaning and the like.

Herein, the RCA cleaning is a semiconductor substrate cleaning method combining H$_2$O$_2$+NH$_4$OH mix solution cleaning and H$_2$O$_2$+HCl mix solution cleaning.

Then, after dry oxidizing, as shown in FIG. 2(a), on the upper surface of the SiC epitaxial substrate 1, the field insulating film 3 is formed having the thin lower insulating film 4 and the thick upper insulating film 5. The lower insulating film 4 is an SiC thermally-oxidized film formed by dry oxidizing of the surface of the SiC epitaxial substrate 1 in an oxygen atmosphere, and has a thickness about 10 nm. Meanwhile, the upper insulating film 5 is formed by an operation other than the thermal oxidizing and has a certain thickness, for example, the upper insulating film 5 is an SiO$_2$ film formed by an atmospheric pressure CVD using oxygen and silane and has thickness of 400 nm. The thermal oxidizing of the lower insulating film 4 is not limited to the dry oxidizing, other oxidizing operations such as i) wet oxidizing and ii) using other oxidizing gas are also usable. The lower insulating film 4 has a thickness less than 50 nm, preferably 5 nm to 20 nm. As described above, forming of the upper insulating film 5 may be after the growth of the lower insulating film 4 on the surface of the SiC epitaxial substrate 1. Contrary to this, after the forming of the upper insulating film 5 followed by the thermal oxidizing, the lower insulating film 4 may be grown between the SiC epitaxial substrate 1 and the upper insulating film 5. In FIG. 2(a), there is provided a first transient SiC thermally-oxidized film 201 which is automatically formed on the backface of the SiC epitaxial substrate 1 in the forming of the lower insulating film 4. The first transient SiC thermally-oxidized film 201 is used for effectively removing a significantly deep-grinding damage layer on the backface of the SiC epitaxial substrate 1.

Operation (b): Then, a photoresist mask {not shown in FIG. 2(b)} is formed on the surface of the SiC epitaxial substrate 1 by photolithography, followed by wet etching of the SiC epitaxial substrate 1 with a buffered hydrofluoric acid solution (BHF=NH$_4$F+HF mix solution), to thereby form the gate window 6 in a certain position of the field insulating film 3, as shown in FIG. 2(b). The above wet etching removes the first transient SiC thermally-oxidized film 201. For forming the gate window 6 that is fine, a dry etching such as reactivity ion etching (RIE) and the like with CF$_4$ gas plasma can be used. In this case, however, at first, the dry-etching is implemented to thereby leave the field insulating film 3 having a thickness of several 10 nm, then the wet etching using the above BHF acid solution replaces the dry-etching. Using the dry etching only for the through-opening of the gate window 6 may damage the SiC surface by plasma, thus deteriorating the gate insulating film 9 to be formed in the subsequent operation (c). After the etching of the gate window 6, the photoresist mask {not shown in FIG. 2(b)} is to be stripped off {see FIG. 2(b)}.

Operation (c): Then, the SiC epitaxial substrate 1 is again cleaned by the RCA cleaning. At the final step of the RCA cleaning, for removing the chemically oxidized film generated on the surface of the open part by the RCA cleaning, the SiC epitaxial substrate 1 is dipped in the BHF acid solution for 5 sec. to 10 sec., followed by a complete rinsing of the BHF acid solution with a super pure water, and still followed by drying. Then, any of the following operation (c1) to operation (c4) is to be implemented, so as to form, on the surface of the epitaxial layer at the base of the gate window 6, the oxide silicon film 10 which includes N (nitrogen) in at least one of the following places: i) in an interface between the first oxide silicon film 10 and the SiC epitaxial substrate 1 and ii) in the vicinity of the interface {see FIG. 2(c)}.

Operation (c1): At first, the SiC epitaxial substrate 1 is thermally-oxidized (for example, dry oxidizing at a temperature 1160° C.), to thereby grow an SiC thermally-oxidized film on the surface of the epitaxial layer at the base of the gate window 6.

Then, the SiC epitaxial substrate 1 is subjected to a heat treatment (or reoxidization) in an oxidized nitrogen (NOx) gas atmosphere, to thereby convert the SiC thermally-oxidized film to the oxide silicon film 10. Examples of the oxidized nitrogen gas (NOx) for the heat treatment (or reoxidization) include i) N$_2$O (nitrous oxide), ii) NO (nitrogen monoxide), iii) NO$_2$ (nitrogen dioxide), iv) a mixture of at least two of i) to iii), v) a diluted gas of any one of i) to iii), and vi) a diluted gas of the mixture iv), each to be properly used. The heat treatment (or reoxidization) temperature can be selected from a range of 1000° C. to 1400° C. In view of shorter treatment time and lower treatment device cost, however, 1100° C. to 1350° C. is practical and preferable.

Operation (c2): The surface of the SiC epitaxial substrate 1 is subjected to a direct thermal oxidizing by the oxidized nitrogen gas (NOx), to thereby form the oxide silicon film 10. Examples of the oxidized nitrogen gas (NOx) for the direct thermal oxidizing include i) N$_2$O (nitrous oxide), ii) NO (nitrogen monoxide), iii) NO$_2$ (nitrogen dioxide), iv) a mixture of at least two of i) to iii), v) a diluted gas of any one of i) to iii), and vi) a diluted gas of the mixture iv), each to be properly used. The heat treatment (or reoxidization) temperature can be selected from a range of 1000° C. to 1400° C. In view of shorter treatment time and lower treatment device cost, however, 1000° C. to 1350° C. is practical and preferable.

Operation (c3): At first, by an operation other than the thermal oxidizing of SiC, an $SiO_2$ film having a certain thickness is formed on the surface of the SiC epitaxial substrate 1. Examples of the operation for forming the $SiO_2$ film include i) chemical vapor deposition (CVD) using oxygen and silane ($SiH_4$) as raw materials, and ii) other forming operations. Specifically, at first, a thin polycrystalline Si film or a thin amorphous Si film is deposited on the entire face of the SiC epitaxial substrate 1, followed by a complete dry oxidizing (thermal oxidizing) at 900° C., to thereby form the $SiO_2$ film.

Then, the SiC epitaxial substrate 1 is subjected to a heat treatment in an oxidized nitrogen (NOx) gas atmosphere (or reoxidization), to thereby convert the $SiO_2$ deposit film to the oxide silicon film 10. Examples of the oxidized nitrogen gas (NOx) for the heat treatment (or reoxidization) include i) $N_2O$ (nitrous oxide), ii) NO (nitrogen monoxide), iii) $NO_2$ (nitrogen dioxide), iv) a mixture of at least two of i) to iii), v) a diluted gas of any one of i) to iii), and vi) a diluted gas of the mixture iv), each to be properly used. The heat treatment (or reoxidization) temperature can be selected from a range of 1000° C. to 1400° C. In view of shorter treatment time and lower treatment device cost, however, 1100° C. to 1350° C. is practical and preferable.

The heat treatment (or reoxidization) in the NOx atmosphere increases density of the oxide silicon film 10, as the case may be, presenting several % to several 10% decrease in film thickness. The above increased density decreasing the film thickness can further improve reliability.

Operation (c4): At first, by the operation in any of the operation (c1) to the operation (c3), the oxide silicon film (intermediate) including N i) in an interface between the first oxide silicon film 10 and the SiC epitaxial substrate 1 or ii) in the vicinity of the interface is so formed as to have a thickness thinner than a certain thickness. Then, on the oxide silicon film (intermediate), the $SiO_2$ film is deposited by an operation {for example, chemical vapor deposition (CVD) with oxygen and silane ($SiH_4$) as raw materials} other than the thermal oxidizing of SiC to such an extent as to obtain the certain thickness, to thereby form the oxide silicon film 10 in combination with the oxide silicon film (intermediate).

In a nutshell, there are various operations for forming the oxide silicon film 10, therefore, any of the operation (c1) to operation (c4) can bring about the effect of the present invention. The oxide silicon film 10 and the forming method therefor are essential for improving TDDB (Time Dependent Dielectric Breakdown) lifetime of the ONO gate insulating film 9.

The operations (c1) to (c4) for forming the oxide silicon film 10 are common in implementing the heat treatment (including oxidization and reoxidization) at a high temperature using the oxidized nitrogen gas (NOx). In terms of setting the heat treatment temperature, however, there is an essential point to be summarized as below:

Preferably, the heat treatment temperature should be so set as to be higher than any heat treatment temperatures for all operations after the forming of the oxide silicon film 10. Under the present invention, the ONO gate insulating film 9 which is formed without meeting the above preferable heat treatment temperature, as the case may be, has the TDDB lifetime decreased than expected or deteriorates the interface between the oxide silicon film 10 and the SiC.

Then, with the oxide silicon film 10 formed at the base of the gate window 6, the SiN film 11 (=second layer of the ONO gate insulating film 9) is deposited on the entire surface of the SiC epitaxial substrate 1 by the LPCVD using $SiH_2Cl_2$ and $O_2$. Immediately after the depositing, the SiC epitaxial substrate 1 is subjected to a pyrogenic oxidization at 950° C., to thereby grow on the surface of the SiN film 11 the SiN thermally-oxidized film 12 (=third layer of the ONO gate insulating film 9) having a certain thickness. FIG. 2(c) shows a cross sectional structure of the SiC epitaxial substrate 1 at this step in the operation.

The SiC epitaxial substrate 1 has a backface which is a transient oxide silicon film 202 automatically formed in the operation for forming the oxide silicon film 10. Likewise, a transient SiN film 203 and a transient SiN thermally-oxidized film 204 are automatically formed on the backface of the SiC epitaxial substrate 1 by, respectively, the depositing of the SiN film 11 and the growing of the SiN thermally-oxidized film 12. Like the first transient SiC thermally-oxidized film 201 {see FIG. 2(a)}, the transient oxide silicon film 202 effectively removes the grinding damage layer on the backface of the SiC epitaxial substrate 1, in addition, featuring an essential function to protect the backface of the SiC epitaxial substrate 1 from dry etching damage which may be caused when the polycrystalline Si on the backface is removed, to be explained in the subsequent operations. Moreover, the transient oxide silicon film 202 can decrease contact resistance of the oxide silicon film 10 (backface electrode 10).

Figure 3:
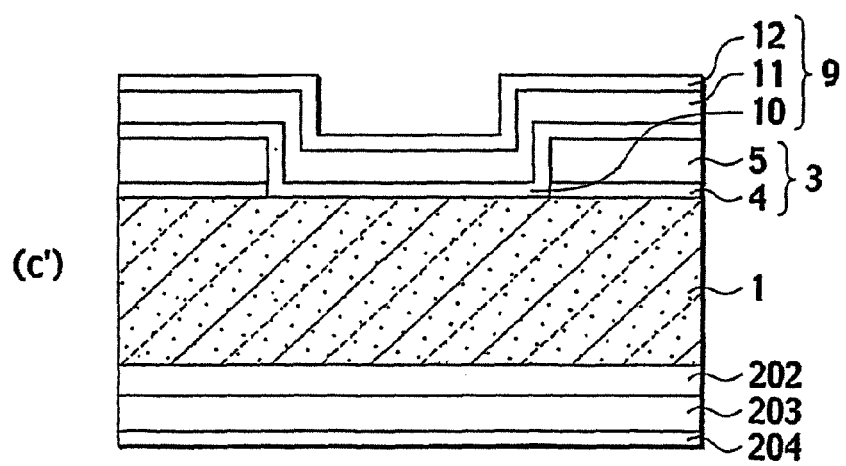
FIG. 3 is a cross sectional view of the production operation of the semiconductor device, according to the first embodiment of the present invention.
Figure 4:
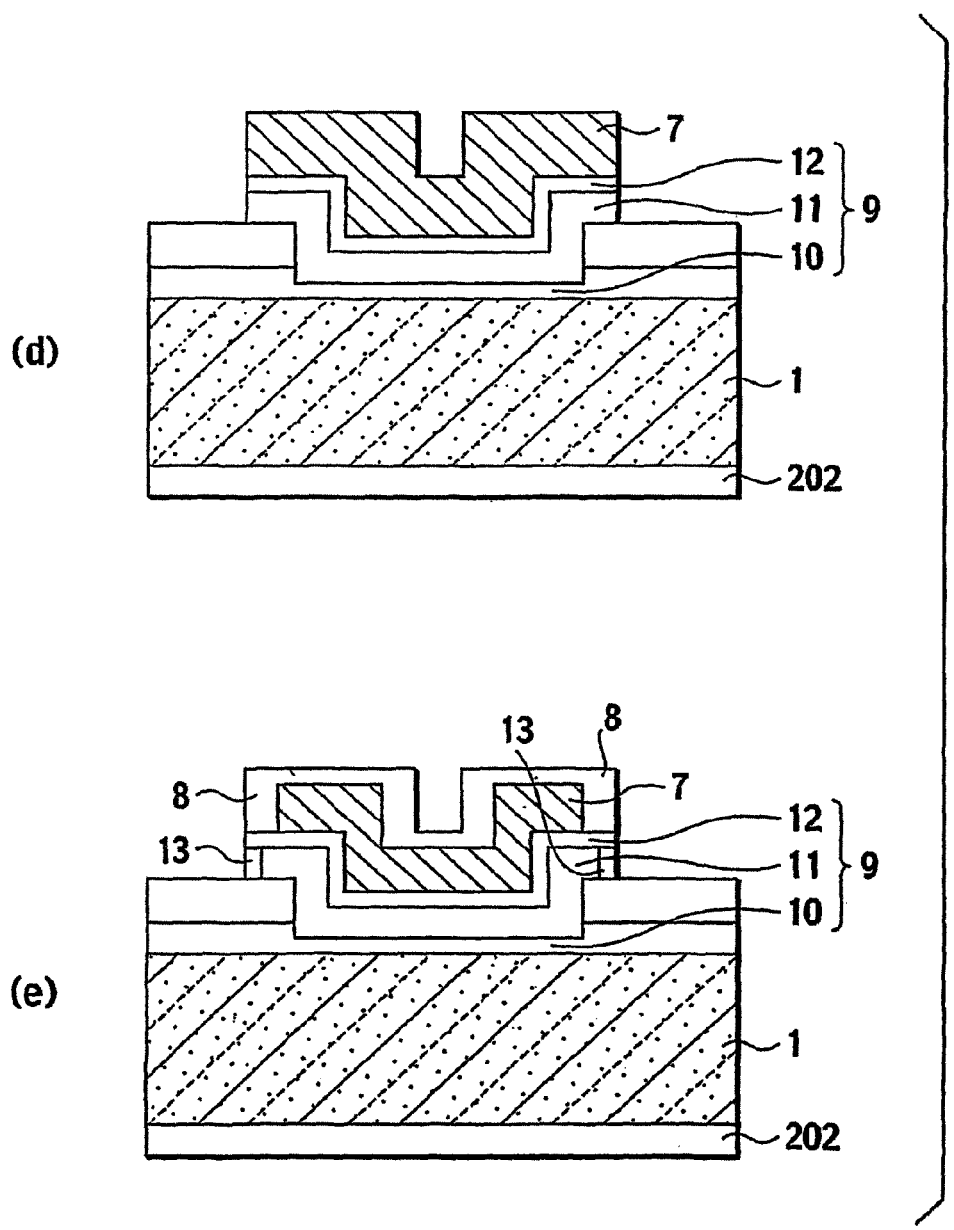
FIG. 4 is a cross sectional view of the production operation of the semiconductor device, according to the first embodiment of the present invention.
Figure 5:
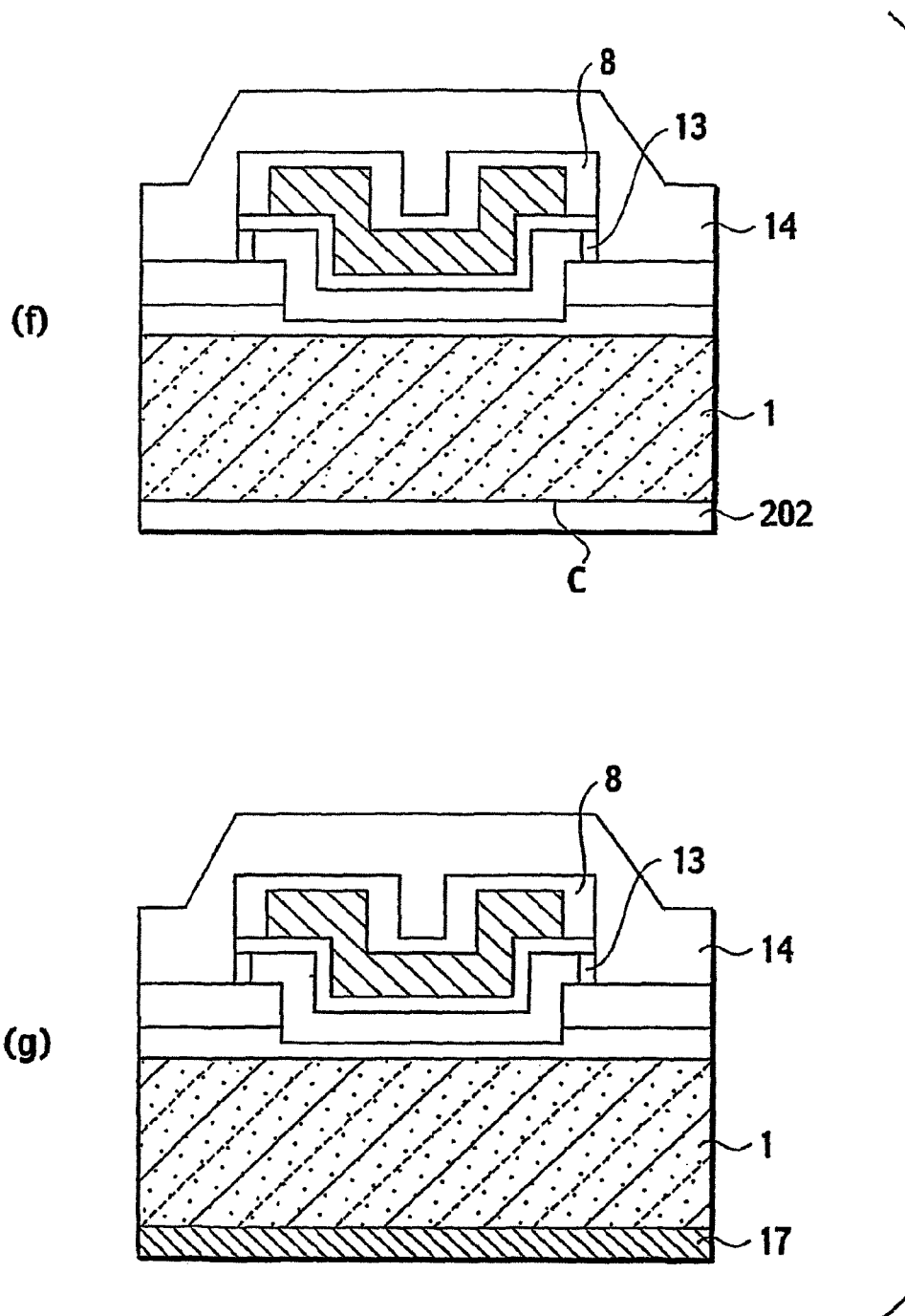
FIG. 5 is a cross sectional view of the production operation of the semiconductor device, according to the first embodiment of the present invention.

Herein, a more detailed drawing of the cross sectional structure formed through any of the operation (c3) and operation (c4) shows the oxide silicon film 10 riding on the field insulating film 3, as shown in FIG. 3(c'). FIG. 3(c') is substantially the same as FIG. 2(c) in that the base of the gate window 6 is covered with the oxide silicon film 10, and therefore, FIG. 3(c') can be schematically drawn like FIG. 2(c) for explaining the subsequent operations, causing no erroneous description of the essentials of the production method under the present invention. For convenience sake, the subsequent operations are to be set forth based on the structure of FIG. 2(c) only.

Herein, under the present invention, in the operation (c1), the SiC epitaxial substrate 1 is at first thermally oxidized, to thereby grow the SiC thermally-oxidized film on the surface of the epitaxial layer at the base of the gate window 6, in the operation (c3), the $SiO_2$ film having a certain thickness is at first formed on the surface of the SiC epitaxial substrate 1 by the operation other than the thermal oxidizing of SiC. The SiC thermally-oxidized film in the operation (c1) and the $SiO_2$ film in the operation (c3) are each referred to as "precursor oxide silicon film." Then, in the heating in the oxidized nitrogen (NOx) gas atmosphere; a new thermally-oxidized film is formed between the precursor oxide silicon film (such as the SiC thermally-oxidized film) and the SiC substrate, where such an operation is referred to as "reoxidization," meanwhile, when the new thermally-oxidized film is not formed, such an operation is referred to as "heat treatment." The above definitions of the reoxidization and heat treatment are to be used likewise hereinafter.

Operation (d): Then, by the low pressure CVD (growth temperature of 600° C. to 700° C.) using silane as raw material, the polycrystalline silicon film having a thickness of 300 nm to 400 nm is formed on the entire surface and backface of the SiC epitaxial substrate 1. Then, P (phosphor) is added to the polycrystalline silicon film by a known heat diffusing method (treatment temperature of 900° C. to 950° C.) using phosphor chlorate ($POCl_3$) and oxygen, to thereby bring about conductivity. For bringing about p type conductivity, B (boron) can be added, replacing the P (phosphor).

Then, a photoresist mask is formed on the surface of the SiC epitaxial substrate 1 by photolithography, then, the polycrystalline Si film, the SiN thermally-oxidized film 12 and the SiN film 11 are sequentially etched by reactivity ion etching (RIE) using $SF_6$, to thereby substantially define (pre-defining) outer edges of i) the polycrystalline Si gate electrode 7, ii) the SiN thermally-oxidized film 12 and iii) the SiN film 11. With the above operation, a nonessential part of the ON layer (O: SiN thermally-oxidized film 12, N: SiN film 11) is etched (removed) accurately in a self-aligning manner by the photoresist mask same as that for the polycrystalline Si gate electrode 7, such that the ON layer can share the outer edge.

Then, the thus used photoresist mask is completely removed, then dry etching of the backface is implemented while protecting the surface of the SiC epitaxial substrate 1 by applying again, to the entire surface of the SiC epitaxial substrate 1, the resist material (photoresist allowed) having a thickness more than or equal to 1 μm, then, the polycrystalline Si film (not shown), the transient SiN thermally-oxidized film 204, and the transient SiN film 203 {see FIG. 2(c)} which three are deposited on the backface side are sequentially removed, and then, the resist material for surface protection is stripped off, to thereby form the cross sectional structure shown in FIG. 4(d).

Operation (e): Then, the SiC epitaxial substrate 1 is again subjected to the RCA cleaning, followed by purifying and drying, and still followed by wet oxidization (pyrogenic oxidization) at 950° C., to thereby simultaneously grow the polycrystalline Si thermally-oxidized film 8 and the SiN sideface thermally-oxidized film 13, respectively, i) on the sideface and upper part of the polycrystalline Si gate electrode 7 and ii) on the sideface of the SiN film 11.

Herein, for improving reliability of the MIS structure including the ONO gate insulating film 9, there are defined three extremely essential points:

1) First, the outer edge part of the SiN film 11 featuring high leakability which film is damaged by the above gate etching is removed by being converted to the SiN sideface thermally-oxidized film 13.

2) Second, the outer edge G of the polycrystalline Si gate electrode 7 is moved back slightly inward relative to the outer edge N of the SiN film 11, to thereby relieve the gate electric field at the outer edge N of the SiN film 11. For moving back the outer edge G of the polycrystalline Si gate electrode 7, the polycrystalline Si's oxidization speed (gate electrode 7) faster than the SiN film's oxidization speed (SiN film 11) is used in the production method, according to the first embodiment of the present invention.

3) Third, adding the polycrystalline Si thermally-oxidized film 8 and the SiN sideface thermally-oxidized film 13 establishes the structure where the ONO gate insulating film 9 localized below the gate electrode 7 is sealed with and protected by the thermally stable material, that is, the polycrystalline Si, the SiC and the thermally-oxidized film.

The thus established structure is essential for inhibiting the ONO gate insulating film 9 from being deteriorated, which deterioration may be caused by an interaction with peripheral members or with the environment in the subsequent high temperature contact annealing (1000° C., 2 min.) and the like.

Operation (f): After the forming of the polycrystalline Si thermally-oxidized film 8 and the SiN sideface thermally-oxidized film 13, the ILD film 14 is deposited on the entire surface of the SiC epitaxial substrate 1 {see FIG. 5(f)}.

Proper materials for the ILD film 14 include i) $SiO_2$ film (about 1 μm in thickness) deposited by an atmospheric pressure CVD using silane and oxygen as raw materials and ii) phosphosilicate glass (PSG) which is i) above added by phosphor (P), but not limited to the above. Other materials capable of withstanding the subsequent various heat treatment operations can be used for the ILD film 14. Then, the SiC epitaxial substrate 1 is put in an ordinary diffusion furnace, followed by a calm heat treatment in an $N_2$ atmosphere for several 10 min., to thereby increase density of the ILD film 14. The heat treatment temperature (for example, 900° C. to 1000° C.) for the above operation is preferably lower than the temperature for forming the oxide silicon film 10.

Operation (g): Then, the photoresist is applied to the entire surface of the SiC epitaxial substrate 1, then a post bake is sufficiently implemented, then volatile component of the photoresist is completely evaporated, then the SiC epitaxial substrate 1 is dipped in the BHF acid solution, then the second transient SiC thermally-oxidized film 202 {see FIG. 5(f)} remaining on the backface of the SiC epitaxial substrate 1 is completely removed, and then the BHF acid solution is cleaned off with the super-pure water. A C face of the thus exposed backface of the SiC epitaxial substrate 1 is clean and free from damage or contaminant. The C face greatly contributes to decreasing resistance of the ohmic contact.

Then, the SiC epitaxial substrate 1 wet with the super-pure water is dried, then immediately is set in a vacuum depositor kept at a high vacuum, and then a certain ohmic contact parent material is vacuum deposited to the backface of the SiC epitaxial substrate 1. Examples of the ohmic contact parent material include Ni film having a thickness of 50 nm to 100 nm, but not specifically limited thereto.

After the vacuum depositing of the ohmic contact parent material, the resist on the surface of the SiC epitaxial substrate 1 is completely stripped off using a special stripper solution, then the SiC epitaxial substrate 1 is sufficiently rinsed and dried, and then is immediately put in a rapid heat treatment device, to thereafter implement contact annealing at 1000° C. in a 100% high purity Ar atmosphere for 2 min. After the heat treatment, as shown in FIG. 5(g), the Ni film is alloyed (silicide) with the low resistance SiC substrate, to thereby form the ohmic contact electrode 17 having an extremely low resistance of at least $10^{-6}$ $\Omega cm^2$ ($10^{-6}$ $\Omega cm^2$ to less than $10^{-5}$ $\Omega cm^2$).

Operation (h): Then, the photoresist mask (not shown) is formed on the surface of the SiC epitaxial substrate 1 by the photolithography. Then, a photoresist as a protective film is applied to the entire backface of the SiC epitaxial substrate 1, followed by a sufficient drying, to thereafter open the gate contact window 15 in the ILD film 14 and the polycrystalline Si thermally-oxidized film 8 (upper face part) by etching which uses the BHF acid solution. Forming of the protecting photoresist on the backface of the SiC epitaxial substrate 1 can be omitted. However, due to the following roles, forming of the protecting photoresist on the backface of the SiC epitaxial substrate 1 is preferable:

1) Inhibiting the ohmic contact electrode 17 from disappearing or being deteriorated after being eluted to the BHF acid solution.

2) Inhibiting the ohmic contact material eluted from the backface of the SiC epitaxial substrate 1 from contaminating the surface of the SiC epitaxial substrate 1.

After the etching is ended, the photoresist mask is completely stripped off by a special stripper solution, to thereby form the structure shown in FIG. 6(h).

Operation (i): Then, the SiC epitaxial substrate 1 is sufficiently cleaned and rinsed, followed by drying, and then is immediately put in a high vacuum magnetron spattering device. Then, a certain wiring material, for example, Al having a thickness of 1 μm thickness is vacuum deposited to the entire surface of the SiC epitaxial substrate 1.

Then, by the photolithography, the photoresist mask (not shown) is formed on the surface of the SiC epitaxial substrate 1 formed with the Al film, then again, a backface electrode protecting photoresist is applied to the backface of the SiC epitaxial substrate 1, then the above resist is sufficiently dried, then the Al film is patterned using a phosphoric acid etching solution, to thereby form the inner wiring 16. The resist of the backface of the SiC epitaxial substrate 1 inhibits disappearing or altering of the ohmic contact electrode 17 on the backface, which disappearing or altering may be caused by the ohmic contact electrode 17's elution in the phosphoric acid etching solution. Without fear for the above disappearing or altering or when the A1 film is etched by the RIE, forming of resist of the backface of the SiC epitaxial substrate 1 can be omitted.

Figure 6:
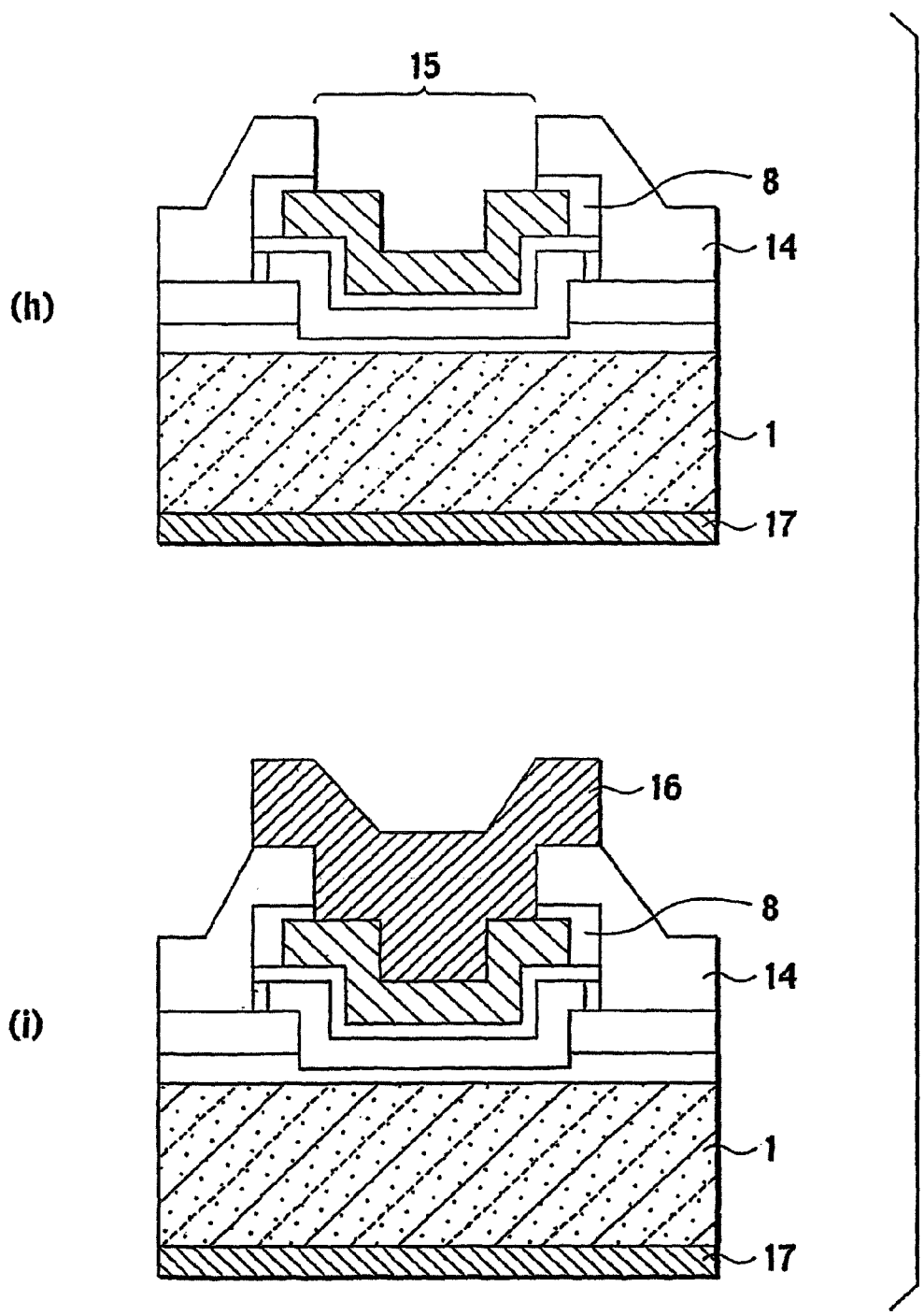
FIG. 6 is a cross sectional view of the production operation of the semiconductor device, according to the first embodiment of the present invention.

Finally, the resist mask and the backface electrode protecting resist are completely removed by a special stripper solution, followed by a sufficient rinsing of the substrate and drying, to thereby form the final structure in FIG. 6(*i*). With the above operations, the silicon carbide semiconductor device 90 having the MIS structure including the ONO gate insulating film 9 is completed, according to the first embodiment of the present invention.

Figure 7:
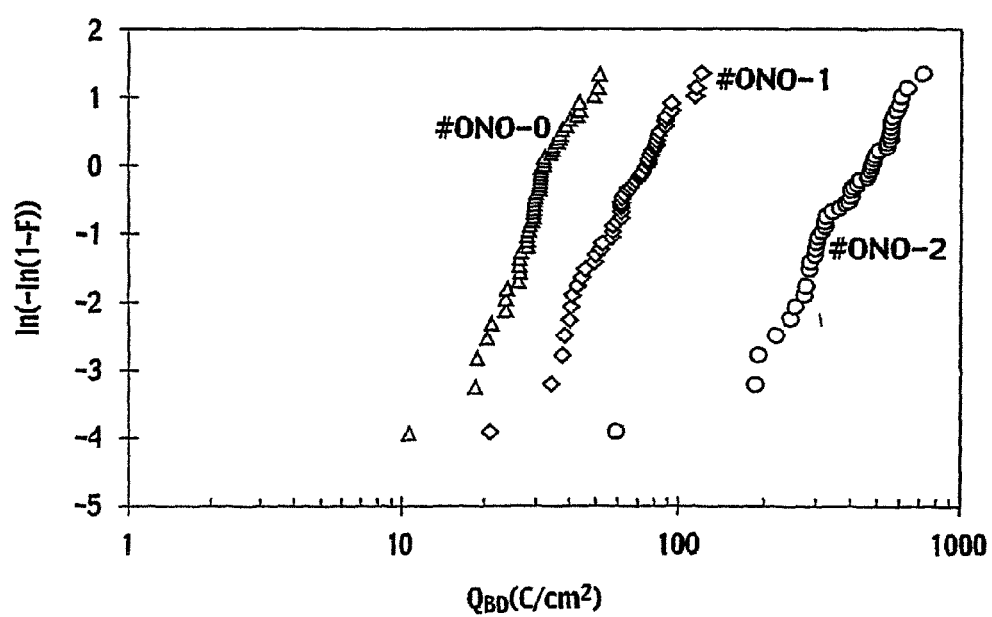
FIG. 7 shows characteristics of a gate insulating film of the semiconductor device, according to the first embodiment of the present invention.

FIG. 7 shows characteristics of the ONO gate insulating film 9 of the semiconductor device 90, according to the first embodiment of the present invention. In FIG. 7, # ONO-1 and # ONO-2 are plots of Weibull distribution, showing results of constant current stress TDDB (Time Dependent Dielectric Breakdown) test on the ONO gate insulating film capacitor (sample size=about 50) thus prepared. # ONO-1 has the oxide silicon film 10 formed by the operation (c1), while # ONO-2 has the oxide silicon film 10 formed by the operation (c3). Although not shown in FIG. 7, the ONO gate insulating films 9, 9 formed by the operation (c2) and the operation (c4) showed like test results. For comparison with the present invention, data (# ONO-0) disclosed by the present inventor based on the conventional technology in the above non-patent document 5 is also shown in FIG. 7.

FIG. 7 has the abscissa denoting electric charge density $Q_{BD}$ (C/cm$^2$) per unit area passing through the gate insulating film up to the TDDB (Time Dependent Dielectric Breakdown), and F in the ordinate denotes cumulative failure rate. $Q_{BD}$ denotes an essential index for measuring reliability corresponding to lifetime.

The test sample has the gate window 6 having an area (opening part) of $3.14 \times 10^{-4}$ cm$^2$, all the ONO gate insulating film 9s have SiO$_2$ film conversion film thickness about 40 nm, and the SiN film 11 and the SiN thermally-oxidized film 12 are respectively 53 nm and 5 nm in thickness. # ONO-1 and # ONO-2 under the present invention have a common heat treatment condition for the oxide silicon film 10, specifically, using N$_2$O gas at 1275° C. for 20 min.

Compared with the test result of # ONO-0 of the conventional technology, the test results # ONO-1 and # ONO-2 according to the first embodiment of the present invention shift the TDDB lifetime to a longer lifetime side (higher $Q_{BD}$) while keeping an inclination of the Weibull distribution curve. The above results denote that, compared with the conventional technology, the TDDB lifetime according to the first embodiment is extended uniformly by a constant magnification without widening the range of distribution. From the graphs in FIG. 7, at the cumulative failure rate F=50%, $Q_{BD}$ (# ONO-0)=30 C/cm$^2$, $Q_{BD}$ (# ONO-1)=64 C/cm$^2$, and $Q_{BD}$ (# ONO-2)=408 C/cm$^2$. Compared with the conventional technology (# ONO-0), the TDDB lifetime according to the first embodiment of the present invention is successfully improved to 2.1 times (=64/30, # ONO-1) to 13.6 times (=408/30, # ONO-2). It is known that the TDDB lifetime of a thermally-oxidized film (thickness of 40 nm, polycrystalline Si gate) on a single crystal Si substrate is preferably $Q_{BD}$ (# Si)=40 C/cm$^2$. Therefore, according to the first embodiment of the present invention, the TDDB lifetime of thermally-oxidized film on the single crystal Si substrate is successfully improved to 1.6 times (=64/40, # ONO-1) to 10.2 times (=408/40, # ONO-2).

As set forth above, according to the conventional technology (non-patent document 5), the TDDB lifetime of the ONO gate insulating film is greatly improved to such an extent as to reach that of the Si thermally-oxidized film, but the ONO gate insulating film is not necessarily sufficient for a long time operation at a temperature higher than a practical upper limit temperature of the Si (MOS) device (the first problem), therefore, further requiring improvement in TDDB lifetime.

Moreover, the ONO gate insulating film according to the conventional technology (non-patent document 5) is so structured as to form the first oxide silicon film (which contacts SiC) with the SiC thermally-oxidized film. Thereby, the high-reliability technology of the conventional gate insulating film cannot be applied (second problem) to a specific MOS (MIS) structural device that is unable to use the SiC thermally-oxidized film due to structural restriction and the like of the device. Examples of the above specific MOS (MIS) structural device include a trench UMOS gate power transistor on 4H—SiC where the gate insulating film is to be formed on a plurality of crystalline faces having different thermal oxidizing speeds.

Under the present invention, the silicon carbide semiconductor device 90 having the MOS structure and the production method therefor can solve any one or both of the first problem and second problem of the conventional technology (non-patent document 5) simultaneously.

<Effect>

As obvious from the explanation of the results in FIG. 7, the first embodiment of the present invention solves the following first problem of the conventional technology (non-patent document 5):

The TDDB lifetime of the ONO gate insulating film is greatly improved to such an extent as to reach that of the Si thermally-oxidized film, but the ONO gate insulating film is not necessarily sufficient for a long time operation at a temperature higher than a practical upper limit temperature of the Si (MOS) device.

In addition, according to the first embodiment of the present invention, through any of the operation (c3) and the operation (c4), the oxide silicon film 10 can be formed by an operation other than the thermal oxidizing of the SiC, in this case, also accomplishing the TDDB lifetime far greater (by digit difference) than that of the conventional technology. Namely, the first embodiment of the present invention solves the following second problem of the conventional technology (non-patent document 5):

The ONO gate insulating film according to the conventional technology (non-patent document 5) is so structured as to form the first oxide silicon film (which contacts SiC) with the SiC thermally-oxidized film. Thereby, the high-reliability technology of the conventional gate insulating film cannot be applied to a specific MOS (MIS) structural device that is unable to use the SiC thermally-oxidized film due to structural restriction and the like of the device.

As set forth above, the silicon carbide semiconductor device according to the first embodiment comprises: 1) a silicon carbide substrate 1; 2) a gate electrode 7 made of polycrystalline silicon; and 3) an ONO insulating film 9 sandwiched between the silicon carbide substrate 1 and the gate electrode 7 to thereby form a gate structure, the ONO insulating film 9 including the followings formed sequentially from the silicon carbide substrate 1: a) a first oxide silicon film 10, b) an SiN film 11, and c) an SiN thermally-oxidized film 12, wherein nitrogen is included in at least one of the following places: i) in the first oxide silicon film 10 and in a vicinity of the silicon carbide substrate 1, and ii) in an interface between the silicon carbide substrate 1 and the first oxide silicon film 10.

The above structure can solve one of the first problem and the second problem of the conventional technology (non-patent document 5) or both of the problems simultaneously. Namely, in terms of solving the first problem, the TDDB lifetime of the ONO gate insulating film 9 can be further improved, and the ONO gate insulating film 9 can be operated for a long time at a temperature higher than a practical upper limit temperature of the Si (MOS) device. Moreover, in terms of solving the second problem, the high-reliability technology of the conventional gate insulating film can be applied to a specific MOS (MIS) structural device that is unable to use the SiC thermally-oxidized film due to structural restriction and the like of the device, examples of the above specific MOS (MIS) structural device including a trench UMOS gate power transistor on 4H—SiC where the gate insulating film is to be formed on a plurality of crystalline faces having different thermal oxidizing speeds.

The first oxide silicon film 10 has a thickness from 3.5 nm to 25 nm, giving a preferable result to the above effect.

The first oxide silicon film 10 has the thickness from 4 nm to 10 nm, giving a more preferable result to the above effect.

The first oxide silicon film 10 is a non-SiC thermally-oxidized film having an increased density, thus further improving reliability.

The silicon carbide semiconductor device 90 is an MOS capacitor, thus realizing the MOS capacitor having the above effect.

In the method for producing the silicon carbide semiconductor device 90 according to the first embodiment, the first oxide silicon film 10 is formed by a heat treatment in an oxidized nitrogen (NOx) gas atmosphere in a period after forming of a precursor oxide silicon film and before depositing of the SiN film 11, see the operation (c1) and the operation (c3). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

In the method for producing the silicon carbide semiconductor device 90 according to the first embodiment, the first oxide silicon film 10 is formed by a reoxidization in an oxidized nitrogen (NOx) gas atmosphere in a period after forming of a precursor oxide silicon film and before depositing of the SiN film (N), see the operation (c1) and the operation (c3). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

In the method for producing the silicon carbide semiconductor device 90 according to the first embodiment, the first oxide silicon film 10 is formed by thermally oxidizing a surface of the silicon carbide substrate 1 in an oxidized nitrogen (NOx) gas atmosphere, see the operation (c2). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

In the method for producing the silicon carbide semiconductor device 90 according to the first embodiment, the first oxide silicon film 10 is formed by the following sequential operations: 1) forming a thin oxide silicon film by one of the following sub-operations: i) the operation (c1): a heat treatment in an oxidized nitrogen (NOx) gas atmosphere in a period after forming of a precursor oxide silicon film and before depositing of the SiN film 11, ii) the operation (c2): a reoxidization in the oxidized nitrogen (NOx) gas atmosphere in the period after forming of the precursor oxide silicon film and before depositing of the SiN film 11, and iii) the operation (c3): thermally oxidizing a surface of the silicon carbide substrate 1 in the oxidized nitrogen (NOx) gas atmosphere, and 2) the operation (c4): depositing, on the thin oxide silicon film, another oxide silicon film which is formed by an operation other than the thermal oxidizing. Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

The oxidized nitrogen (NOx) gas atmosphere is formed by supplying any one of the following gases : i) $N_2O$ (nitrous oxide), ii) NO (nitrogen monoxide), iii) $NO_2$ (nitrogen dioxide), iv) a mixture of at least two of i) to iii), v) a diluted gas of any of i) to iii), and vi) a diluted gas of the mixture in iv). See the operation (c1) to the operation (c4). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

Any of the heat treatment, the reoxidization and the thermal oxidization in the oxidized nitrogen (NOx) gas atmosphere is implemented in a temperature range of 1000° C. to 1400° C., see the operation (c1) to the operation (c4). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

Any of the heat treatment, the reoxidization and the thermal oxidization in the oxidized nitrogen (NOx) gas atmosphere is implemented in the temperature range of 1100° C. to 1350° C., see the operation (c1) to the operation (c4). In view of shorter treatment time and lower treatment device cost, 1100° C. to 1350° C. is practical and preferable.

The precursor oxide silicon film is formed by thermally oxidizing a surface of the silicon carbide substrate 1, see the operation (c1). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

The precursor oxide silicon film is formed by a depositing operation other than a thermal oxidizing, see the operation (c3). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

The depositing operation other than the thermal oxidizing is a chemical vapor deposition, see the operation (c3). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

The precursor oxide silicon film is formed by thermally oxidizing any of a polycrystalline silicon and an amorphous silicon film which are deposited by a chemical vapor deposition, see the operation (c3). Thereby, the oxide silicon film 10 including N in the SiC interface or in the vicinity of the SiC interface can be formed easily, thus producing easily the silicon carbide semiconductor device 90 which brings about an effect such as improving the TDDB lifetime of the ONO gate insulating film 9.

An operation after forming of the first oxide silicon film 10 is implemented at a temperature less than or equal to a temperature of any of the heat treatment, the reoxidization and the thermal oxidizing in the oxidized nitrogen (NOx) gas atmosphere, see the operation (c1) to the operation (c4). Thereby, the decreased TDDB lifetime or the deteriorated interface between the oxide silicon film 10 and the SiC can be inhibited.

<<Second Embodiment>>

According to the first embodiment, the ONO gate insulating film MIS structure (capacitor) having the field insulating film 3 on both sides of a gate area is disclosed. The present invention is, however, not limited to the MIS structure having the above field insulating film 3, and is applicable to a structure free from the field insulating film 3, bringing about the like effect.

<Structure>

Figure 8:
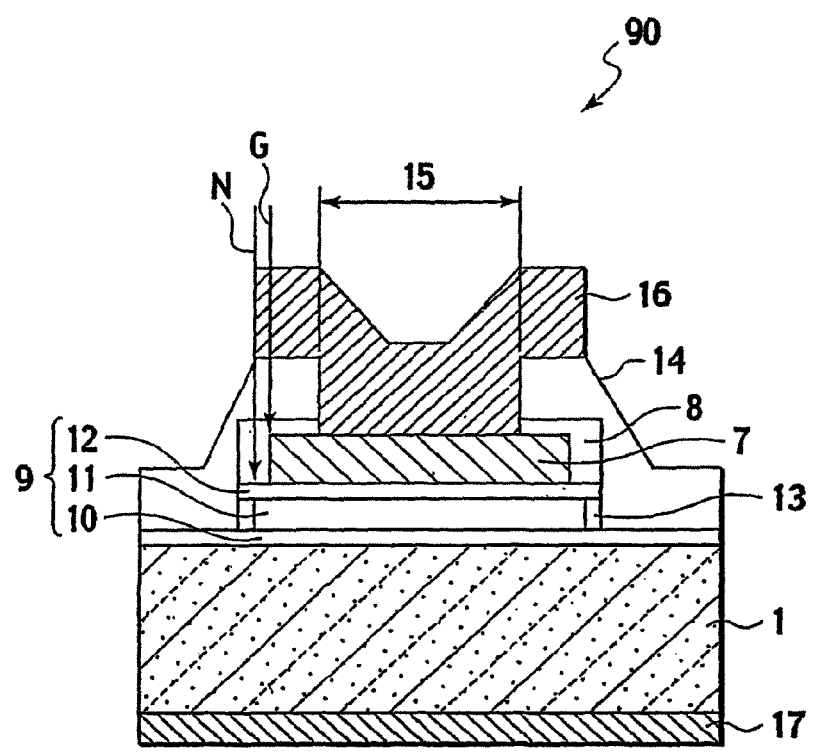
FIG. 8 is a cross sectional view of essential parts of the semiconductor device, according to the second embodiment of the present invention.
Figure 9:
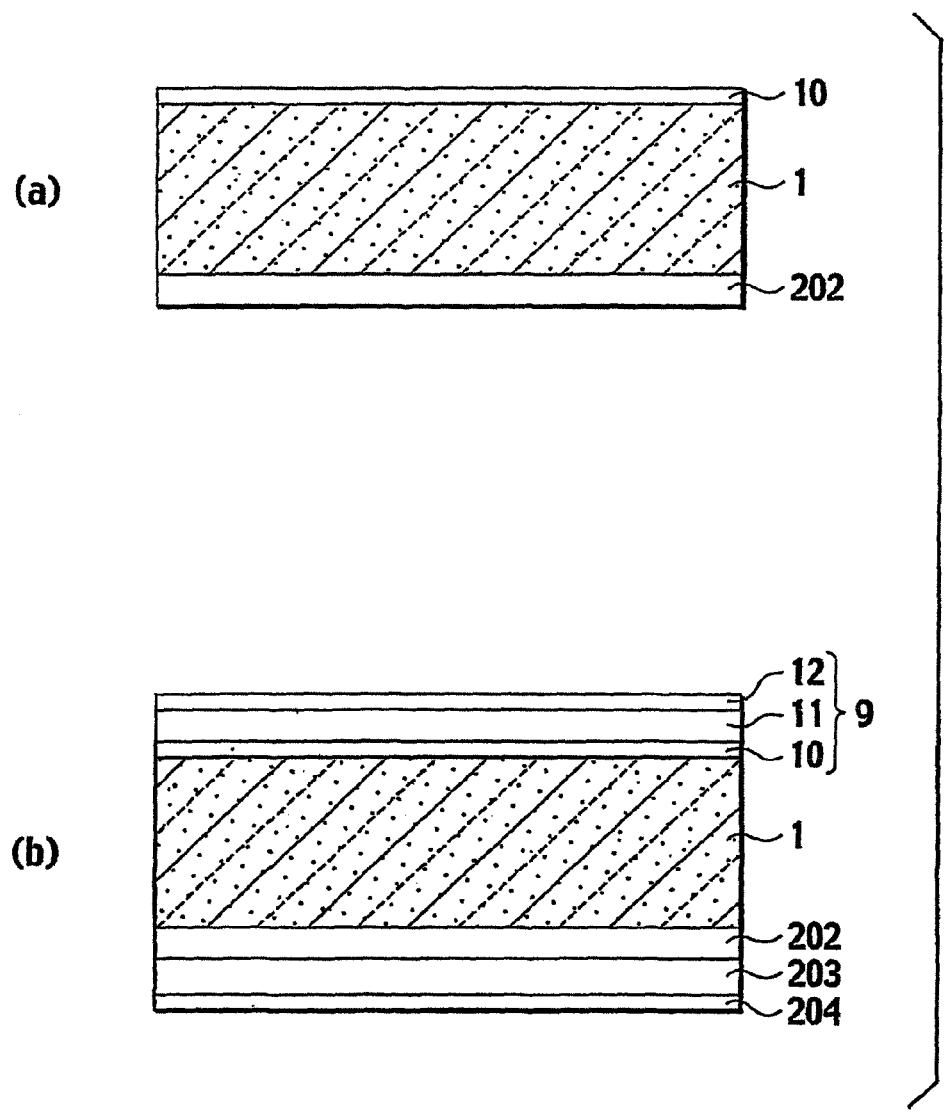
FIG. 9 is a cross sectional view of the production operation of the semiconductor device, according to the second embodiment of the present invention.
Figure 10:
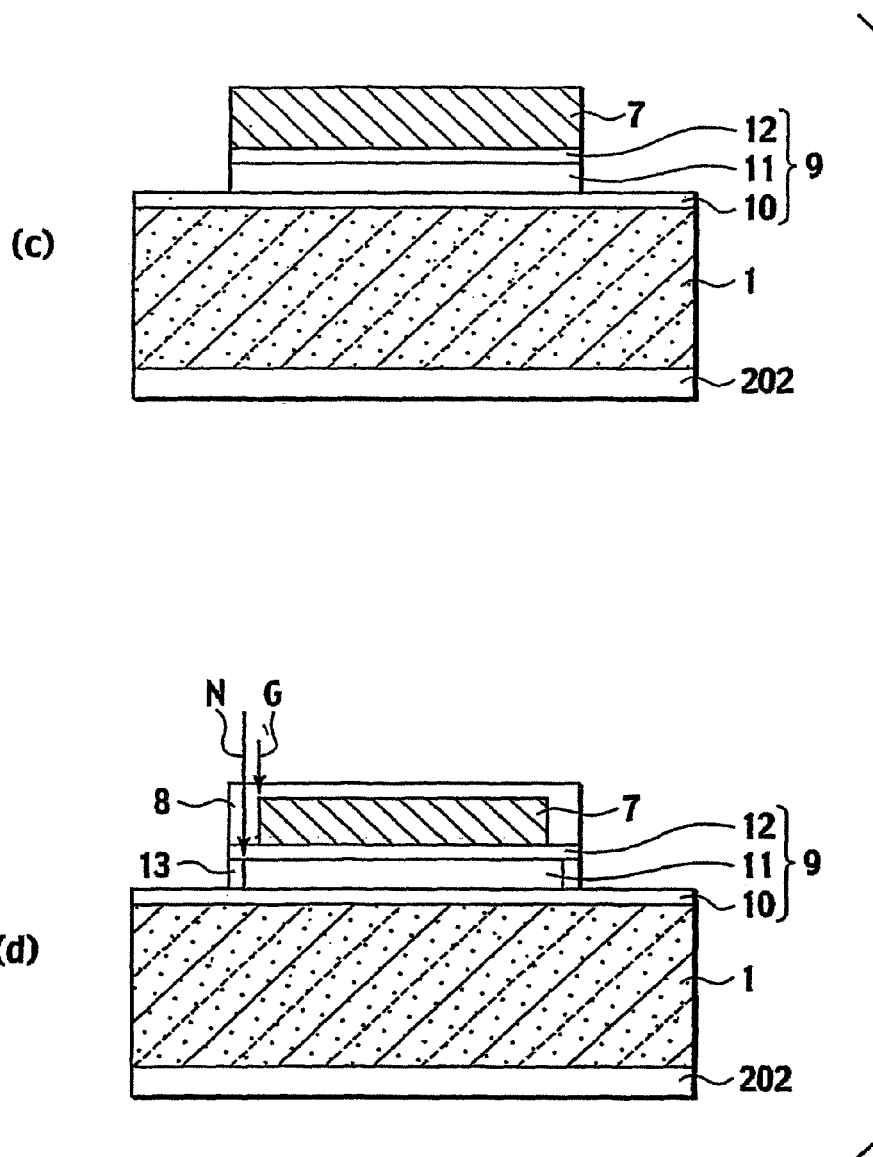
FIG. 10 is a cross sectional view of the production operation of the semiconductor device, according to the second embodiment of the present invention.
Figure 11:
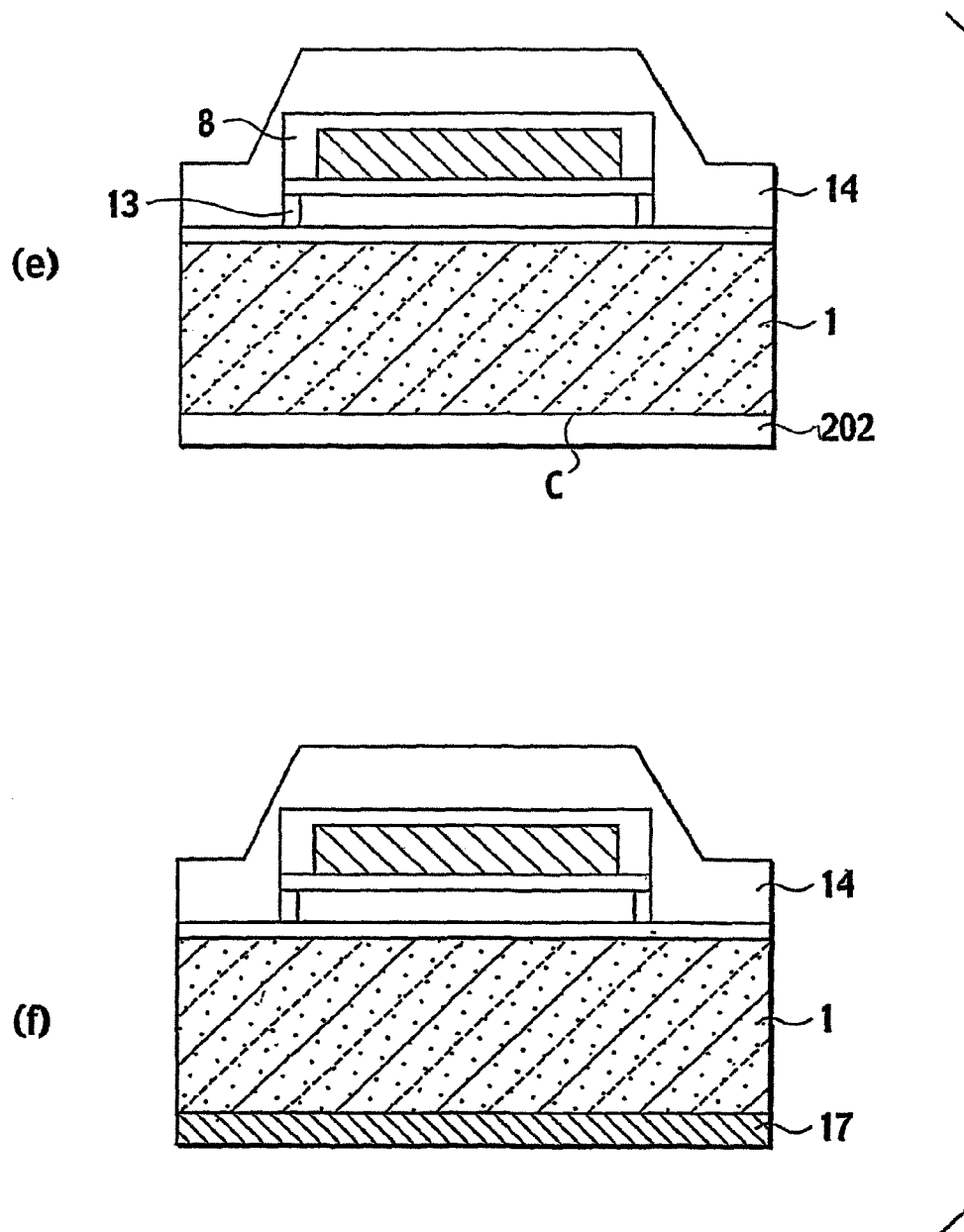
FIG. 11 is a cross sectional view of the production operation of the semiconductor device, according to the second embodiment of the present invention.

FIG. 8 is a cross sectional view of an essential part of a silicon carbide semiconductor device 90 having an MIS structure (capacitor) including a high-reliability ONO layered film, according to a second embodiment of the present invention. Structural elements of the second embodiment substantially same as those according to the first embedment are denoted by the same reference numerals, and the explanation thereabout will be simplified or, as the case may be, omitted for avoiding prolixity.

There is provided the N$^+$ type SiC epitaxial substrate 1 including an upper face having an n$^-$ type epitaxial layer. At least on the sideface of the polycrystalline Si gate electrode 7, there is provided the polycrystalline Si thermally-oxidized film 8 grown by thermal oxidizing. Between the SiC epitaxial substrate 1 and the polycrystalline Si gate electrode 7, the ONO gate insulating film 9 having the 3-layer structure is sandwiched.

The lowermost part (SiC epitaxial substrate 1 side) of the 3-layer structure of the ONO gate insulating film 9, namely, the thin oxide silicon film 10 includes N (nitrogen) in at least one of the following places: i) in an interface between the first oxide silicon film 10 and the SiC epitaxial substrate 1 and ii) in the vicinity of the interface. The oxide silicon film 10 has a thickness from 3.5 nm to 25 nm, especially, thickness from 4 nm to 10 nm giving an extremely preferable result.

Of the 3-layer structure of the ONO gate insulating film 9, the SiN film 11 is the intermediate layer (=N) deposited by the LPCVD and the like, and the SiN thermally-oxidized film 12 grown by oxidizing the surface of the SiN film 11 is the uppermost layer (=O). Each of the SiN film 11 (including the SiN sideface thermally-oxidized film 13) and the SiN thermally-oxidized film 12 is so formed as to share the outer edge with the gate electrode 7 (including the polycrystalline Si thermally-oxidized film 8). The SiN film 11 and the SiN thermally-oxidized film 12 have thickness, for example, 53 nm and 5 nm respectively. On the outer edge sideface of the SiN film 11, there is disposed the thin SiN sideface thermally-oxidized film 13 (namely, SiO$_2$ film) grown by thermally-oxidizing the SiN film 11. The SiN sideface thermally-oxidized film 13 is an essential element for securing reliability of the ONO gate insulating film 9.

Moreover, the outer edge G of the polycrystalline Si gate electrode 7 is to be positioned inside the outer edge N of the SiN film 11. Failure of meeting the above positioning of the outer edge G will considerably decrease reliability of the ONO gate insulating film 9, therefore, like the first embodiment, positioning of both of the outer edge G and the outer edge N should be accurately controlled according to the second embodiment.

On the gate electrode 7 and the oxide silicon film 10 (periphery of the gate electrode 7), the ILD film 14 is formed. The ILD film 14 is formed with the gate contact window 15 opening through the gate electrode 7. Via the gate contact window 15, the inner wiring 16 connects the gate electrode 7 to other circuit element(s) on the same substrate or to the outer circuit.

On the backface of the SiC epitaxial substrate 1, there is disposed the ohmic contact electrode 17 having an extremely low resistance. The ohmic contact electrode 17 is formed by the following sequential operations: i) a contact metal such as Ni is vacuum deposited on the back of the SiC epitaxial substrate 1, ii) alloying the thus obtained with SiC by a rapid heat treatment at a temperature lower than the thermal oxidizing temperature for the oxide silicon film 10 (namely, SiC thermally-oxidized film) of the ONO gate insulating film 9, for example, 1000° C. relative to the thermal oxidizing at 1100° C.

<Production Method>

Then, referring to FIG. 9(a) to FIG. 11(f), a method for producing the MIS structure (see FIG. 8) including the ONO gate insulating film 9 is to be explained, according to the second embodiment of the present invention.

Operation (a): A (0001) Si face 8° off cut n$^+$ type 4H—SiC epitaxial substrate 1 having an upper surface where a high-quality n$^-$ type epitaxial layer is grown is sufficiently cleaned by the RCA cleaning and the like. Then, after dry oxidizing, an SiC thermally-oxidized film having a thickness about 10 nm is grown, thereafter immediately dipping the SiC epitaxial substrate 1 in a buffered hydrofluoric acid solution (BHF=NH$_4$F+HF mix solution) and then removing the BHF acid solution.

The above sacrificial oxidization operation can inhibit, to a certain extent, i) a contaminant on the surface of the SiC epitaxial substrate 1 or ii) a potential defect attributable to crystal imperfection from entering the oxide silicon film 10. The SiC epitaxial substrate 1 after the sacrificial oxidization is again subjected to the RCA cleaning, and then is dipped in the BHF acid solution for 5 sec. to 10 sec. so as to remove the chemically oxidized film generated on the surface of the SiC epitaxial substrate 1 at the final step of the cleaning. After the above operation, the BHF acid solution is completely rinsed off with the super-pure water, to thereafter dry the SiC epitaxial substrate 1.

Immediately, by any of the operation (c1) to the operation (c4) according to the first embodiment, the oxide silicon film 10 is grown on the entire surface of the SiC epitaxial substrate 1. Herein, the heat treatment temperature in the oxidized nitrogen (NOx) gas atmosphere is set higher than any other heat treatment temperature in the subsequent operations. FIG. 9(a) shows a cross sectional structure of the MIS structure at this step in the operation.

In FIG. 9(a), the SiC epitaxial substrate 1 has the backface which is the transient oxide silicon film 202 automatically formed in the operation for forming the oxide silicon film 10. The transient oxide silicon film 202 effectively removes the grinding damage layer on the backface of the SiC epitaxial substrate 1, in addition, featuring an essential function to protect the backface of the SiC epitaxial substrate 1 from dry etching damage which may be caused when the polycrystalline Si on the backface is removed, to be explained in the subsequent operations.

Operation (b): After the forming of the oxide silicon film 10, the SiN film 11 (=second layer of the ONO gate insulating film 9) is deposited on the entire surface of the SiC epitaxial substrate 1 by the LPCVD using $SiH_2Cl_2$ and $O_2$. Immediately after the depositing, the SiC epitaxial substrate 1 is subjected to the pyrogenic oxidization at 950° C., to thereby grow on the surface of the SiN film 11 the SiN thermally-oxidized film 12 (=third layer of the ONO gate insulating film 9) having a certain thickness. FIG. 9(b) shows a cross sectional structure of the SiC epitaxial substrate 1 at this step in the operation. The transient SiN film 203 and the transient SiN thermally-oxidized film 204 are automatically formed on the backface of the SiC epitaxial substrate 1 by, respectively, the depositing of the SiN film 11 and the growing of the SiN thermally-oxidized film 12.

Operation (c): Then, by the low pressure CVD (growth temperature of 600° C. to 700° C.) using silane as raw material, the polycrystalline silicon film having a thickness of 300 nm to 400 nm is formed on the entire surface and backface of the SiC epitaxial substrate 1. Then, by a known heat diffusing method (treatment temperature 900° C. to 950° C.) using phosphor chlorate ($POCl_3$) and oxygen, P (phosphor) having n type impurity is added to the polycrystalline silicon film, to thereby bring about conductivity. Replacing the n type impurity hereinabove, a p type impurity can be added.

Then, a photoresist mask (not shown) is formed on the surface of the SiC epitaxial substrate 1 by photolithography, then, the polycrystalline Si film, the SiN thermally-oxidized film 12 and the SiN film 11 are sequentially etched by reactivity ion etching (RIE) using $SF_6$, to thereby substantially define (pre-defining) outer edges of i) the polycrystalline Si gate electrode 7, ii) the SiN thermally-oxidized film 12 and iii) the SiN film 11. With the above operation, a nonessential part of the ON layer (O: SiN thermally-oxidized film 12, N: SiN film 11) is etched (removed) accurately in a self-aligning manner by the photoresist mask same as that for the polycrystalline Si gate electrode 7, such that the ON layer can share an outer edge. At this step in the operation, however, micron-level positional relation between the outer edge G of the polycrystalline Si gate electrode 7 and the outer edge N of the SiN film 11 depends on the used RIE device or etchant gas and is therefore variable. The outer edge G of the polycrystalline Si gate electrode 7 may be outside the outer edge N of the SiN film 11, or a reverse positioning may occur.

There is an important reminder for the sequential etching operations, that is, to leave the oxide silicon film 10, in other words, not completely removing the oxide silicon film 10. An overetching to completely remove the oxide silicon film 10 allows a crystalline grating damage by plasma to enter the surface of the SiC epitaxial substrate 1 thus exposed. With this, in the RIE of the SiN film 11, an etchant gas having a high selectivity to the $SiO_2$ is to be used and an etching end point is to be accurately sensed, to thereby prevent the overetching.

After the sequential etching operations, the used resist is completely removed, then the back side of the SiC epitaxial substrate 1 is subjected to the dry etching while protecting the surface by applying again to the entire surface of the SiC epitaxial substrate 1 the resist material (photoresist is allowable) having a thickness of more than or equal to 1 μm, then the transient polycrystalline Si film (including thermally-oxidized film thereof, both not shown), the transient SiN thermally-oxidized film 204, the transient SiN film 203 {refer to FIG. 9(b)} which are deposited on the back side are sequentially removed, and then the resist material for protecting the surface is stripped off, to thereby form the cross sectional structure in FIG. 10(c).

Operation (d): Then, the SiC epitaxial substrate 1 is again subjected to the RCA cleaning, purifying-drying, followed by the wet oxidization (pyrogenic oxidization) at 950° C., to thereby simultaneously grow the polycrystalline Si thermally-oxidized film 8 and the SiN sideface thermally-oxidized film 13, respectively, i) on the sideface and upper part of the polycrystalline Si gate electrode 7 and ii) on the sideface of the SiN film 11.

Herein, for improving reliability of the MIS structure including the ONO gate insulating film 9, there are three extremely essential points:

1) First, the outer edge part of the SiN film 11 featuring high leakability which film is damaged by the above gate etching is removed by being converted to the SiN sideface thermally-oxidized film 13.

2) Second, the outer edge G of the polycrystalline Si gate electrode 7 is moved back slightly inward relative to the outer edge N of the SiN film 11, to thereby relieve the gate electric field at the outer edge N of the SiN film 11.

For moving back the outer edge G of the polycrystalline Si gate electrode 7, the polycrystalline Si's oxidization speed (gate electrode 7) faster than the SiN film's oxidization speed (SiN film 11) is used in the production method according to the second embodiment of the present invention.

3) Third, adding the polycrystalline Si thermally-oxidized film 8 and the SiN sideface thermally-oxidized film 13 establishes the structure where the ONO gate insulating film 9 localized below the gate electrode 7 is sealed with and protected by the thermally stable material, that is, the polycrystalline Si, the SiC and thermally-oxidized film.

The thus established structure is essential for inhibiting the ONO gate insulating film 9 from being deteriorated, which deterioration may be caused by an interaction with peripheral members or with the environment in the subsequent high temperature contact annealing (1000° C., 2 min.) and the like.

Operation (e): After the forming of the polycrystalline Si thermally-oxidized film 8 and the SiN sideface thermally-oxidized film 13, the ILD film 14 is deposited on the entire surface of the SiC epitaxial substrate 1 {see FIG. 11(e)}. Proper materials for the ILD film 14 include i) $SiO_2$ film (about 1 μm in thickness) deposited by an atmospheric pressure CVD using silane and oxygen as raw materials, and ii) phosphosilicate glass (PSG) which is i) above added by phosphor (P), but not limited to the above. Other materials capable of withstanding the subsequent various heat treatment operations can be used for the ILD film 14.

Then, the SiC epitaxial substrate 1 is put into an ordinary diffusion furnace, followed by a calm heat treatment in an $N_2$ atmosphere for several 10 min., to thereby increase density of the ILD film 14. The heat treatment temperature (for example, 900° C. to 1000° C.) in the above operation is preferably lower than that for the oxide silicon film 10.

Operation (f): Then, the photoresist is applied to the surface of the SiC epitaxial substrate 1, then a post bake is sufficiently implemented, then volatile component of the resist is completely evaporated, then the SiC epitaxial substrate 1 is dipped in the BHF acid solution, then the second transient oxide silicon film 202 {see FIG. 11(e)} remaining on the backface of the SiC epitaxial substrate 1 is completely removed, and then the BHF acid solution is cleaned off with the super-pure water. The C face of the thus exposed backface of the SiC epitaxial substrate 1 is clean and free from damage or contaminant. The C face greatly contributes to decreasing resistance of the ohmic contact.

Then, the SiC epitaxial substrate 1 wet with the super-pure water is dried, then immediately is set in the vacuum depositor kept at a high vacuum, and then a certain ohmic contact parent material is vacuum deposited to the backface of the SiC epitaxial substrate 1. Examples of the ohmic contact parent material include Ni film having a thickness of 50 nm to 100 nm, but not specifically limited thereto.

After the vacuum depositing of the ohmic contact parent material, the resist on the surface of the SiC epitaxial substrate 1 is completely stripped off with a special stripper solution, then the SiC epitaxial substrate 1 is sufficiently rinsed and dried, and then is immediately put in a rapid heat treatment device, to thereafter implement contact annealing at 1000° C. in a 100% high purity Ar atmosphere for 2 min. After the heat treatment, as shown in FIG. 11(f), the Ni film is alloyed (silicide) with the low resistance SiC substrate, to thereby form the ohmic contact electrode 17 having an extremely low resistance of at least $10^{-6}$ $\Omega cm^2$ ($10^{-6}$ $\Omega cm^2$ to less than $10^{-5}$ $\Omega cm^2$).

Operation (g): Hereinafter, by substantially the same operations as those according to the first embodiment, the gate contact window 15 and the inner wiring 16 are disposed on the SiC epitaxial substrate 1, according to the second embodiment. Then, the MIS structure including the ONO gate insulating film 9 shown in FIG. 8 is completed, according to the second embodiment of the present invention.

<Effect>

The thus prepared MIS structure including the ONO gate insulating film 9 according to the second embodiment showed as excellent TDDB lifetime as that according to the first embodiment in FIG. 7. Namely, the second embodiment of the present invention solves the following first problem of the conventional technology (non-patent document 5):

The TDDB lifetime of the ONO gate insulating film is greatly improved to such an extent as to reach that of the Si thermally-oxidized film, but the ONO gate insulating film is not necessarily sufficient for a long time operation at a temperature higher than a practical upper limit temperature of the Si (MOS) device.

In addition, according to the second embodiment of the present invention, through any of the operation (c3) combined with the (c4), the oxide silicon film 10 can be formed by an operation other than above thermal oxidizing of the SiC, in this case, also accomplishing the TDDB lifetime far greater (by digit difference) than that of the conventional technology. Namely, the second embodiment of the present invention solves the following second problem of the conventional technology (non-patent document 5):

The ONO gate insulating film according to the conventional technology (non-patent document 5) is so structured as to form the first oxide silicon film (which contacts SiC) with the SiC thermally-oxidized film. Thereby, the high-reliability technology of the conventional gate insulating film cannot be applied to a specific MOS (MIS) structural device that is unable to use the SiC thermally-oxidized film due to structural restriction and the like of the device.

<<Third Embodiment>>

According to a third embodiment of the present invention, a standard n channel type planar power MOSFET cell is disclosed. Herein, the present invention is applicable to any cell forms including: square cell, hexagonal cell, circular cell, bipectinate (linear) cell and the like.

<Structure>

Figure 12:
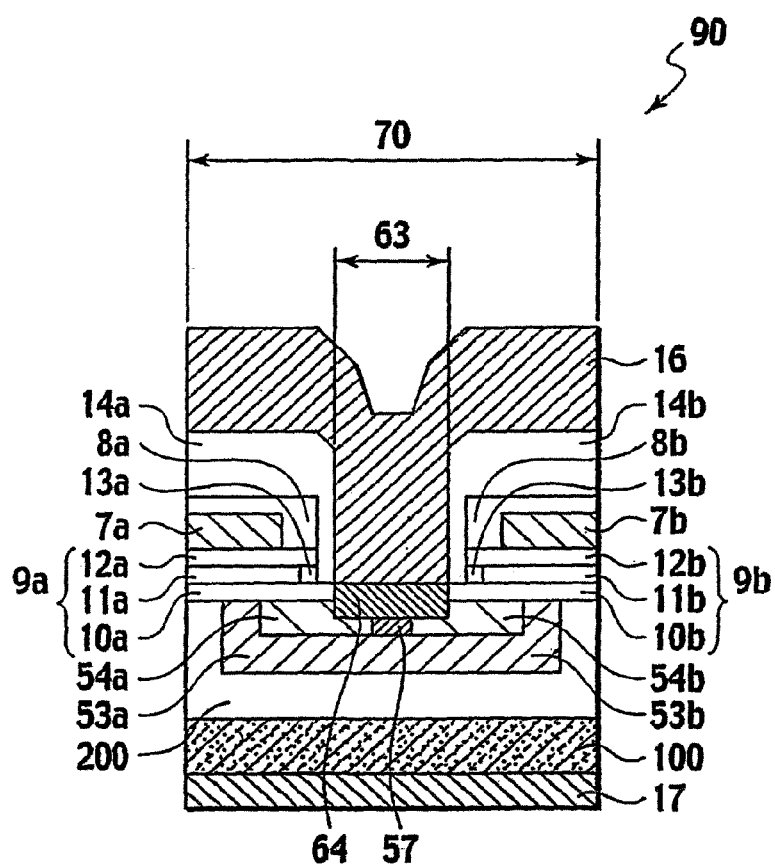
FIG. 12 is a cross sectional view of essential parts of a semiconductor device, according to the third embodiment of the present invention.

FIG. 12 is a cross sectional view of essential parts of a power MOSFET cell, according to the third embodiment of the present invention.

In FIG. 12, there is provided an $n^+$ type single crystal SiC substrate 100. On an upper surface (main face on upper side) of the $n^+$ type single crystal SiC substrate 100, a first $n^-$ type epitaxial layer 200 (10 μm in thickness) to which nitrogen ($1 \times 10^{16}/cm^3$) is added is grown homo-epitaxially. In FIG. 1 and FIG. 8 according to the respective first embodiment and second embodiment, though not shown, an $n^-$ type epitaxial layer has a structure same as that of the first $n^-$ type epitaxial layer 200 in FIG. 12 according to the third embodiment. Substrates having other structural systems such as 4H, 6H, 3C and 15R can be used, where H denotes hexagonal system, C denotes cubic system and R denotes rhombohedral system.

In a certain area of the surface layer of the $n^-$ type epitaxial layer 200, there are provided p type base areas 53a, 53b each having a certain depth and to which p type impurity is slighted added. In a certain area of the surface layer of each of the respective p type base areas 53a, 53b, $n^+$ type source areas 54a, 54b shallower than the p type base areas 53a, 53b are formed apart from outer edge boundaries of the respective p type base areas 53a, 53b at a constant distance. On a substrate surface layer in the center of the p type base areas 53a, 53b, a $p^+$ type base contact area 57 shallower than the p type base areas 53a, 53b are sandwiched between the $n^+$ type source areas 54a, 54b.

Selectively formed on the surface of the SiC substrate 100 are ONO gate insulating films 9a, 9b. The ONO gate insulating films 9a, 9b each have 3-layer structure, having a sequential deposition, from lower side (the SiC substrate 100 side) thereof, including oxide silicon films 10a, 10b, SiN films 11a, 11b and SiN thermally-oxidized films 12a, 12b. Needless to say, the oxide silicon films 10a, 10b are thin and include N (nitrogen) in at least one of the following places: i) in an interface between the oxide silicon films 10a, 10b and the SiC substrate 100 and ii) in the vicinity of the interface. The oxide silicon films 10a, 10b each have a thickness from 3.5 nm to 25 nm, especially, thickness from 4 nm to 10 nm giving an extremely preferable result. On sidefaces of the SiN films 11a, 11b, respectively, there are disposed SiN sideface thermally-oxidized films 13a, 13b grown by thermally-oxidizing the SiN films 11a, 11b.

On the ONO gate insulating films 9a, 9b, respectively, there are provided conductive gate electrodes 7a, 7b made of polycrystalline Si. At upper parts and on sidefaces of the polycrystalline Si gate electrodes 7a, 7b, respectively, there are provided polycrystalline Si sideface thermally-oxidized films 8a, 8b.

On the SiC substrate 100 including the polycrystalline Si sideface thermally-oxidized films 8a, 8b, there are formed ILD films 14a, 14b. A source window 63 opened in the ILD films 14a, 14b passes through the $n^+$ type source areas 54a, 54b and the $p^+$ type base contact area 57. At the base of the source window 63, there is formed a source contact electrode 64. The source contact electrode 64 is formed by the following sequential operations: i) a thin metal film parent material such as Ni is selectively disposed at the base of the source window 63, and ii) alloying the thus obtained with SiC by a rapid heat treatment. The source contact electrode 64 realizes an ohmic contact simultaneously with the n+ type source areas 54a, 54b and the p+ type base contact area 57. On a backface of the SiC substrate 100, there is a drain electrode 17 formed by an operation like the operation for forming the source contact electrode 64. Via the source window 63, the inner wiring 16 connects the source contact electrode 64 to other circuit element(s) on the same substrate or to the outer circuit.

<Production Method>

Figure 13:
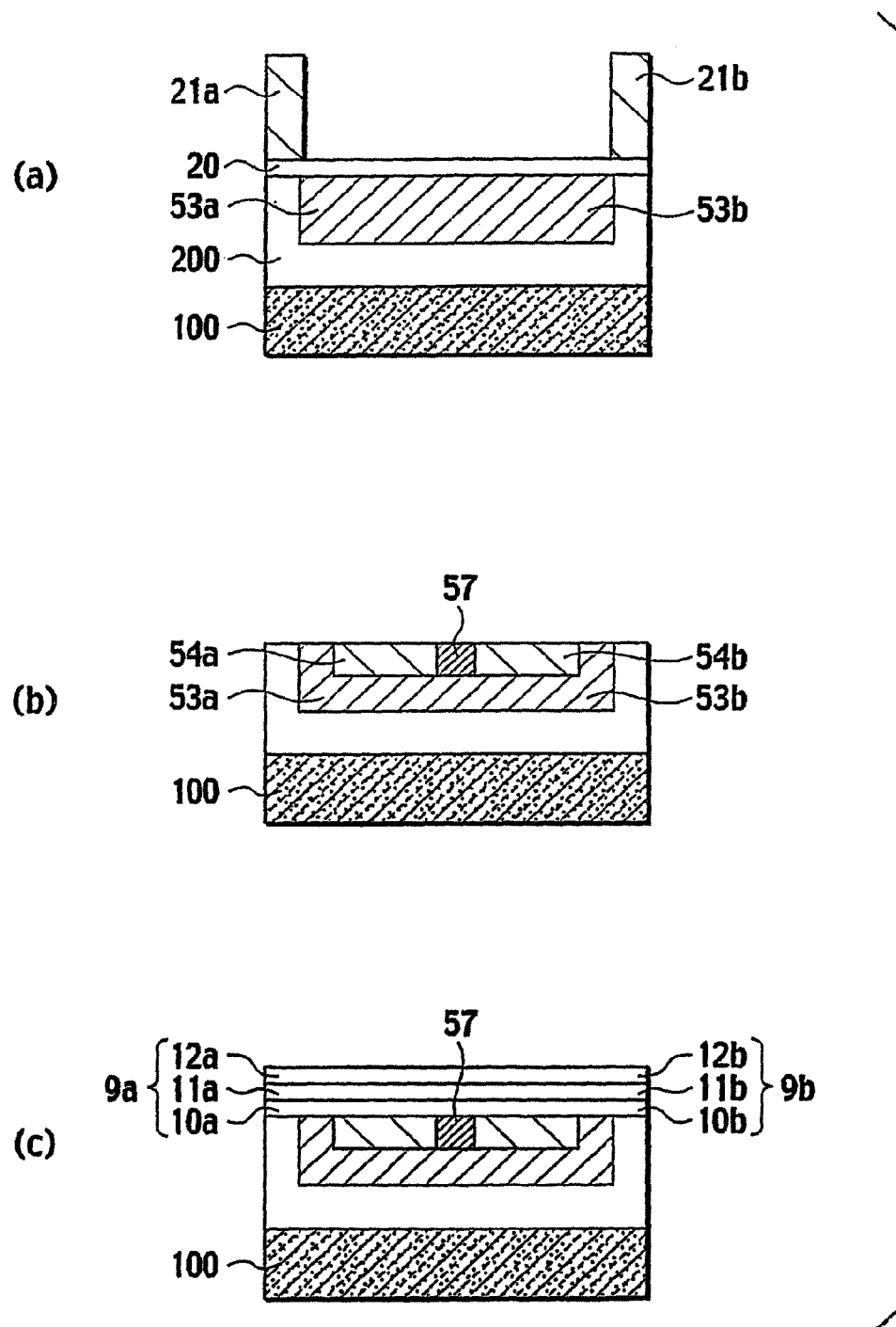
FIG. 13 is a cross sectional view of the production operation of the semiconductor device, according to the third embodiment of the present invention.
Figure 16:
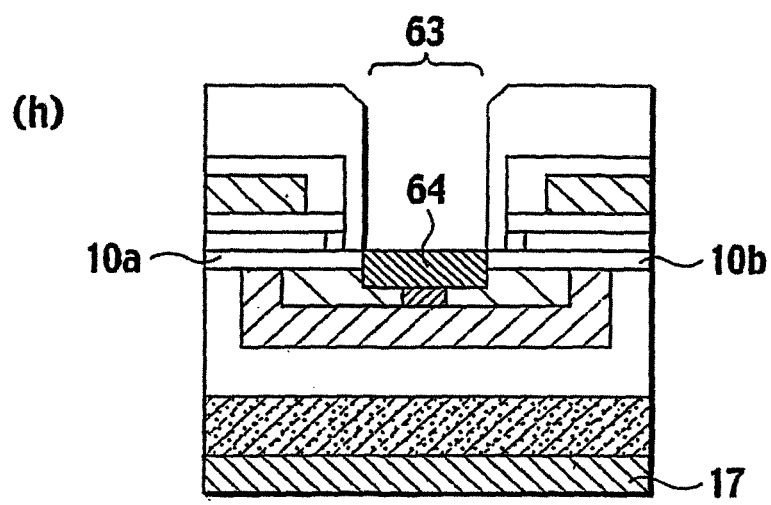
FIG. 16 is a cross sectional view of the production operation of the semiconductor device, according to the third embodiment of the present invention.

Then, referring to FIG. 13(*a*) to FIG. 16(*h*), a method for producing the planar type power MOSFET cell is to be explained, according to the third embodiment of the present invention.

Operation (a): At first, the n+ type SiC epitaxial substrate 100 is prepared having the main face on which the n− type epitaxial layer 200 is grown homo-epitaxially, and then a CVD oxide film 20 having a thickness of 20 nm to 30 nm is deposited on the surface of the n− type epitaxial layer 200. Then, on the thus obtained, a polycrystalline Si film (thickness about 1.5 μm) as an ion implantation mask is formed by the LPCVD (low pressure chemical vapor deposition). Other than the polycrystalline Si film, any of $SiO_2$ film and PSG (phosphosilicate glass) film which are formed by the CVD may be used. The CVD oxide film 20 can be omitted. The CVD oxide film 20, is however, preferred to be used due to its useful effects and functions (see below) when the polycrystalline Si film is used as the ion implantation mask:

(1) Working as a protective film for preventing the polycrystalline Si film from causing an unexpected reaction with the n− type epitaxial layer 200, (2) Sensing an end point for anisotropy etching of the polycrystalline Si mask and working as an etching stopper film, (3) Working as a surface protective film in ion implantation of the p type base impurity.

Then, using anisotropy etching operations such as photolithography, reactivity ion etching (RIE) and the like, the polycrystalline Si film above an area where the p type base areas 53a, 53b are to be formed is vertically removed, to thereafter form first ion implantation masks 21a, 21b. Etchant gases such as $SF_6$ used for the RIE of the polycrystalline Si film enables i) a high selectivity etching to the thermally-oxidized film and ii) an end point sensing, preventing the plasma damage to the surface of the SiC substrate 100, especially, to the channel area.

Then, p type impurity ion is implanted, to thereby form the p type base areas 53a, 53b, as shown in FIG. 13(*a*). Actually, the polycrystalline Si film is adhered to the backface of the SiC substrate 100, however, not shown in FIG. 13(*a*). An example of the selective ion implantation condition for the p type base areas 53a, 53b includes:

Impurity: Al+ ion
Substrate temperature: 750° C.
Acceleration voltage/dose: 360 keV/5×10$^{-13}$ cm$^{-2}$ After the ion implantation of the p type base, the CVD oxide film 20 and the first ion implantation masks 21a, 21b are removed by the wet etching.

Operation (b): Then, the n+ type source areas 54a, 54b and the p+ type base contact area 57 are formed, as shown in FIG. 13(*b*), by implementing substantially the same operations as those for the selective ion implantation of the p type base areas 53a, 53b.

Examples of the selective ion implantation condition for the n+ type source areas 54a, 54b include:

Impurity: P+ ion
Substrate temperature: 500° C.
Acceleration voltage/dose: 160 keV/2.0×10$^{15}$ cm$^{-2}$
100 keV/1.0×10$^{15}$ cm$^{-2}$
70 keV/6.0×10$^{14}$ cm$^{-2}$
40 keV/5.0×10$^{14}$ cm$^{-2}$ Moreover, an example of the selective ion implantation condition for the p+ type base contact area 57 includes:

Impurity: Al+ ion
Substrate temperature: 750° C.
Acceleration voltage/dose: 100 keV/3.0×10$^{15}$ cm$^{-2}$
70 keV/2.0×10$^{15}$ cm$^{-2}$
50 keV/1.0×10$^{15}$ cm$^{-2}$
30 keV/1.0×10$^{15}$ cm$^{-2}$ After all the ion implantation operations ended, the SiC substrate 100 is dipped in a mix solution of hydrofluoric acid and nitric acid, completely removing i) all the masks used and ii) unnecessary mask materials adhered to the backface of the SiC substrate 100. For removing the mask, the SiC substrate 100 can be alternately dipped in heat phosphoric acid solution and BHF solution, to thereby sequentially remove the polycrystalline Si film and the $SiO_2$ film.

Then, the SiC substrate 100 with the mask removed is cleaned and dried, followed by a heat treatment at 1700° C. for 1 min. in a high-purity atmospheric pressure Ar atmosphere, to thereby activate, once for all, all the conductive impurities that are ion-implanted on the p type base areas 53a, 53b, the n+ type source areas 54a, 54b and the p+ type base contact area 57.

Operation (c): Then, the SiC substrate 100 sufficiently cleaned by the RCA cleaning and the like is thermally-oxidized in a dry oxygen atmosphere, to thereby grow the thermally-oxidized film on the surface and backface of the SiC substrate 100, then, immediately remove the film with the BHF acid solution. The sacrificial oxide film has a thickness less than 50 nm, preferably 5 nm to 20 nm. The SiC substrate 100 after the sacrificial oxidization is, again, sufficiently cleaned by the RCA cleaning. Then, a thick insulating film is formed on the surface of the SiC substrate 100 by the thermal oxidizing, the CVD and the like, to thereby form, by i) a known photolithography and ii) a known dry or wet etching, 1) a field area (not shown) having a thick oxide film and 2) an element area (unit cell) 70 (refer to FIG. 12) free from the thick oxide film. Hereinabove, at this step in the operation, the element area 70 is substantially the same in shape as that in FIG. 13(*b*), though leaving a difference in that an outer periphery of the element area 70 is formed with the field area (not shown).

Then, the SiC substrate 100 is, again, sufficiently cleaned by the RCA cleaning and the like. For removing the chemically oxidized film ($SiO_2$) formed on the surface of the element area 70 at the final step of the cleaning, the element area 70 (the SiC substrate 100) is dipped in a dilute hydrofluoric acid solution for 5 sec. to 10 sec., followed by a complete rinsing off of the dilute hydrofluoric acid solution with the super-pure water, and still followed by drying. Immediately after that, the oxide silicon films 10a, 10b, namely, the first layers of the ONO gate insulating films 9a, 9b are formed on the surface of the SiC substrate 100 of the element area 70. For forming the oxide silicon films 10a, 10b, any of the operation (c1) to the operation (c4) according to the first embodiment can be arbitrarily used.

Then, the SiN films 11a, 11b (second layers) are deposited by the LPCVD on the oxide silicon films 10a, 10b. Finally, the SiN films 11a, 11b are thermally-oxidized (for example, pyrogenic oxidization) for growing the SiN thermally-oxidized films 12a, 12b (third layer) on the surface, to thereby obtain the structure in FIG. 13(*c*). A film having the ONO structure is formed also on the backface of the epitaxial substrate 100, however, not shown in FIG. 13(*c*). Conditions for forming each of the films according to the third embodiment can be substantially the same as those according to the first embodiment and the second embodiment of the present invention.

Herein, an essential point is that the NOx heat treatment temperature for the oxide silicon films 10*a*, 10*b* should be set higher than any of heat treatment temperatures in the subsequent operations. A rapid heat treatment is implemented hereinafter at 1000° C. for realizing an ohmic contact between the source contact electrode 64 on the surface and the drain electrode 17 on the backface. Therefore, a higher temperature, for example, 1275° C. can be selected for the heat treatment of the oxide silicon films 10*a*, 10*b*.

Operation (d): Then, on the entire surface and backface of the SiC substrate 100, a polycrystalline Si film having a thickness of 300 nm to 400 nm is formed by a low pressure CVD (growth temperature of 600° C. to 700° C.) using silane as raw material. Then, an n type impurity P (phosphor) is added to the polycrystalline Si film by a known heat diffusing method (treatment temperature 900° C. to 950° C.) using phosphor chlorate ($POCl_3$) and oxygen, to thereby bring about conductivity. A p type impurity such as B (boron) and the like can be added, replacing the P (phosphor).

Then, by the photolithography and the reactivity ion etching (RIE) (which uses $C_2F_6$ and oxygen as etchants), unnecessary parts are sequentially removed from i) the polycrystalline Si film on the surface of the epitaxial substrate 100 side, and ii) the SiN thermally-oxidized films 12*a*, 12*b* and SiN films 11*a*, 11*b* of the ONO gate insulating films 9*a*, 9*b*. Then, removing the photoresist brings about the structure in FIG. 14(*d*). In this operation, the gate electrodes 7*a*, 7*b* are defined (position specified). Herein, the polycrystalline Si film is formed also on the backface of the epitaxial substrate 100, however, not shown in FIG. 14(*d*).

Operation (e): Then, after the RIE, the SiC epitaxial substrate 100 is subjected to the RCA cleaning, followed by purifying-drying and the wet oxidization (pyrogenic oxidization) at 950° C., to thereby simultaneously grow the polycrystalline Si thermally-oxidized films 8*a*, 8*b* and the SiN sideface thermally-oxidized films 13*a*, 13*b*, respectively, i) on the sideface and upper part of the polycrystalline Si gate electrodes 7*a*, 7*b* and ii) on the sideface of the SiN films 11*a*, 11*b*, as shown in FIG. 14(*e*).

Figure 14:
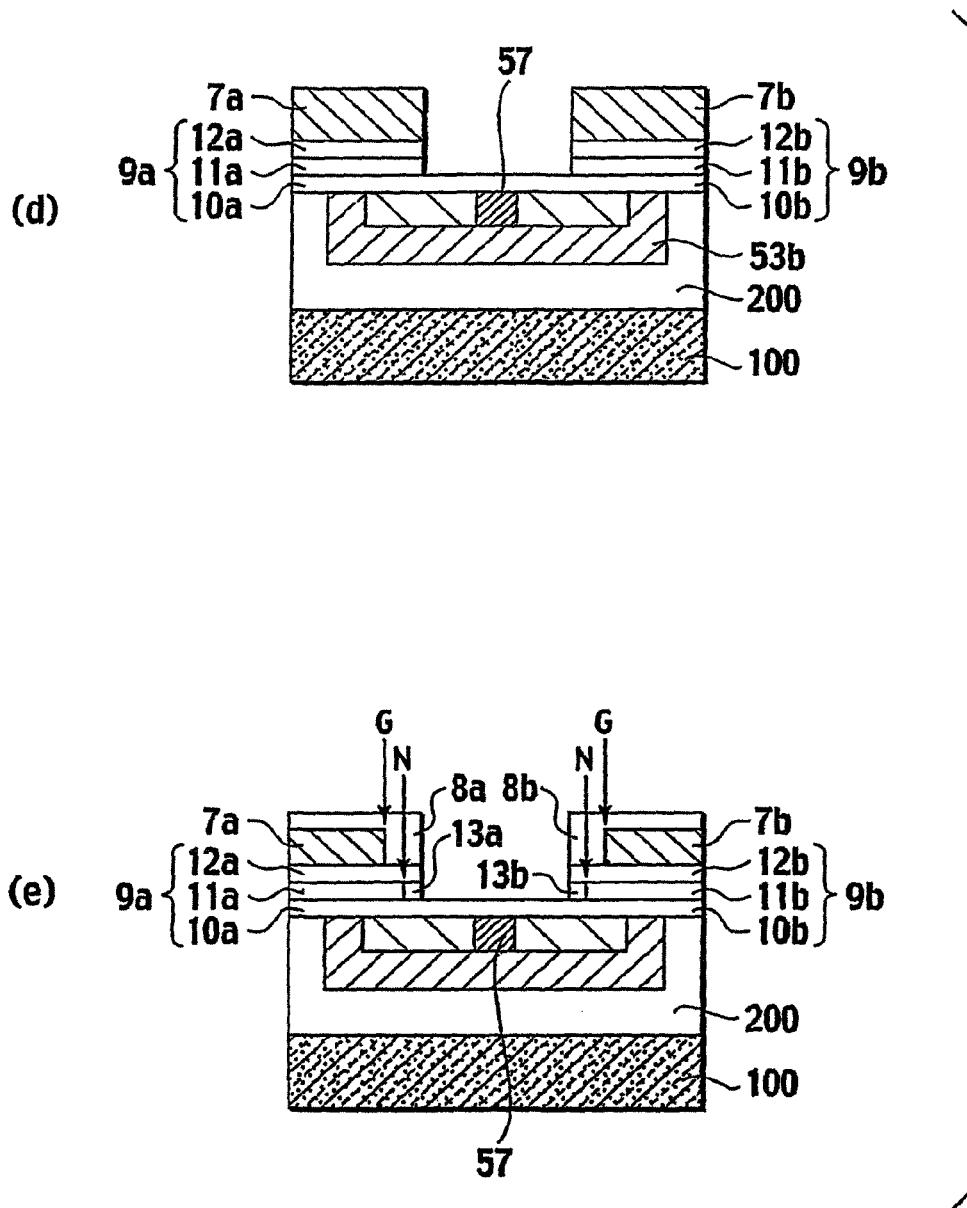
FIG. 14 is a cross sectional view of the production operation of the semiconductor device, according to the third embodiment of the present invention.

In this operation (e), the sideface at the outer edge part of the leak-current SiN film which sideface is damaged by the gate etching in the operation (d) is removed by converting the sideface to the thermally-oxidized films 13*a*, 13*b*, and as shown in FIG. 14(*e*), the outer edge G of each of the polycrystalline Si gate electrodes 7*a*, 7*b* is moved back slightly inward relative to the outer edge N of each of the SiN films 11*a*, 11*b*, to thereby relieve the gate electric field at the outer edge N of each of the SiN films 11*a*, 11*b*, thus improving reliability. For moving back the outer edge G of each of the polycrystalline Si gate electrodes 7*a*, 7*b*, the polycrystalline Si's oxidization speed (gate electrodes 7*a*, 7*b*) faster than the SiN film's oxidization speed (SiN films 11*a*, 11*b*) is used in the production method, according to the third embodiment of the present invention.

Moreover, in this operation (e), adding the polycrystalline Si thermally-oxidized films 8*a*, 8*b* and the SiN sideface thermally-oxidized films 13*a*, 13*b* establishes a structure where the ONO gate insulating films 9*a*, 9*b* localized below the gate electrodes 7*a*, 7*b* respectively are sealed with and protected by the thermally stable material, that is, the polycrystalline Si, the SiC and the thermally-oxidized film. The thus established structure is essential for inhibiting the ONO gate insulating films 9*a*, 9*b* from being deteriorated, which deterioration may be caused by the interaction with the peripheral members or with the environment in the subsequent high temperature contact annealing (1000° C., 2 min.) and the like. Herein, the polycrystalline Si thermally-oxidized films 8*a*, 8*b* can be formed at the upper part of the gate electrodes 7*a*, 7*b* (not only the sideface thereof), decreasing thickness of the polycrystalline Si gate electrodes 7*a*, 7*b*. In view of the thus decreased thickness, an initial thickness of the crystal Si gate electrodes 7*a*, 7*b* is specified.

Figure 15:
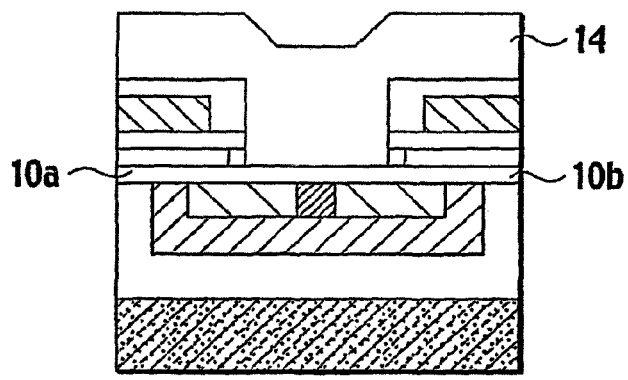
FIG. 15 is a cross sectional view of the production operation of the semiconductor device, according to the third embodiment of the present invention.
Figure 15:
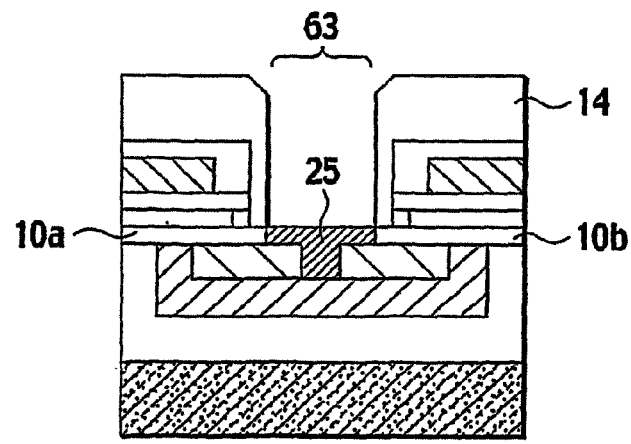

Operation (f): Then, as shown in FIG. 15(*f*), the ILD film 14 is deposited on the entire surface of the SiC substrate 100. Proper materials for the ILD film 14 include i) $SiO_2$ film (=NSG, about 1 μm in thickness) deposited by an atmospheric pressure CVD using silane and oxygen as raw materials, ii) phosphosilicate glass (PSG) which is i) above added by phosphor (P) and iii) boron phosphosilicate glass (BPSG) which is ii) above added by boron, but not limited to the above.

Then, the SiC substrate 100 is put in an ordinary diffusion furnace, followed by a calm heat treatment in an $N_2$ atmosphere for several 10 min., to thereby increase density of the ILD film 14. The heat treatment temperature (for example 900° C. to 1000° C.) for the above operation is preferably lower than the temperature for forming (thermally oxidizing) the oxide silicon films 10*a*, 10*b*.

Operation (g): Then, by i) a known photolithography and ii) a known dry or wet etching, the source window 63 is opened a) in the ILD film 14 on the surface of the SiC substrate 100 side and b) in the oxide silicon films 10*a*, 10*b* each of which is the SiC thermally-oxidized film of the ONO gate insulating film 9. A gate contact window (not shown) formed around the element area 70 in FIG. 12 is opened simultaneously with the above operation. When the etchant solution or gas goes to the back of the SiC substrate 100, the thermally-oxidized film (not shown) on the transient polycrystalline Si film on the backface is also simultaneously removed.

After the etching of the ILD film 14 and oxide silicon films 10*a*, 10*b*, a source contact electrode parent material 25 is vacuum deposited, by a film-forming operation such as DC (direct current) spattering and the like, on the entire surface of the SiC substrate 100 where the photoresist-etching mask remains. Ni film or CO film having a thickness, for example, 50 nm can be used for the source contact electrode parent material 25.

After the vacuum depositing of the source contact electrode parent material 25, the SiC substrate 100 is dipped in a special photoresist stripper, to thereby completely remove the photoresist remaining on the surface of the SiC substrate 100. With this, as shown in FIG. 15(*g*), a substrate structure is formed where the source contact electrode parent material 25 is deposited only on the source window 63 and at the base of the gate contact window (drawing lines and signs are not shown).

Operation (h): Then, the SiC substrate 100 is sufficiently rinsed and dried, then a protective resist material (photoresist is allowable) having a thickness of more than or equal to 1 μm is applied to the entire surface of the SiC substrate 100, to thereafter sequentially remove, by dry etching, the polycrystalline silicon film, the SiN thermally-oxidized film and the SiN film (not shown) which are remaining on the backface of the SiC substrate 100 side. The above protective resist is used for inhibiting the source contact electrode parent material 25 and the gate insulating films 10a, 10b from being deteriorated, which deterioration may be caused by plasma damage, charging or contaminant in the dry etching.

Then, the SiC substrate 100 is dipped in the BHF acid solution, to thereby remove a transient SiC thermally-oxidized film (not shown) formed in the forming of the oxide silicon films 10a, 10b, thus exposing a pure crystalline face on the backface of the epitaxial substrate 100. The BHF acid solution is completely rinsed off with the super-pure water, followed by drying, then the SiC substrate 100 is immediately set in a vacuum depositor kept at high vacuum, to thereby vacuum deposit a certain drain contact electrode parent material (not shown) on the backface. Examples of the certain drain contact electrode parent material on the backface includes Ni film or CO film having a thickness of 50 nm to 100 nm.

Then, the resist used for protecting the surface is completely stripped off with a special stripper solution, then the epitaxial substrate 100 is sufficiently cleaned, rinsed and dried, then the epitaxial substrate 100 is immediately set at a rapid heat treatment device, and then is subjected to a rapid heat treatment (contact annealing) in a high-purity Ar atmosphere at 1000° C. for 2 min. By the above heat treatment, the contact electrode parent materials (Ni film) deposited on i) the base of the source window 63 {see the source contact electrode parent material 25 in FIG. 15(g)}, ii) the base of the gate contact window (not shown) and iii) the backface of the gate contact window (not shown) are alloyed respectively with I) the $n^+$ type source areas 54a, 54b (/$p^+$ type base contact area 57) {see FIG. 13(b)}, II} the polycrystalline Si gate electrode contact area (not shown), and III) the backface of the $n^+$ type SiC epitaxial substrate 100, thus respectively forming A) the source contact electrode 64, B) the gate electrode (not shown) and C) the drain electrode 17 which three causing an ohmic contact featuring an extremely low resistance, to thereby form the substrate structure in FIG. 16(h).

Operation (i): Finally, the SiC substrate 100 after the contact annealing is set at a magnetron spattering device kept in a high vacuum, then a certain wiring material, for example, Al film is vacuum deposited, by a thickness of 3 μm, to the entire surface of the SiC substrate 100.

Then, the photoresist mask is formed, by the photolithography, on the upper face of the SiC substrate 100 formed with the Al film, then a backface electrode protecting photoresist is applied to the backface of the SiC substrate 100, then this photoresist is sufficiently dried, and then the Al film is patterned by the RIE, to thereby form an inner wiring (not shown) connecting to the inner wiring 16 (connecting to the source contact electrode 64) and to the gate electrode contact, as shown in FIG. 12.

Finally, the resist mask is completely removed with the special stripper solution, and the SiC substrate 100 is sufficiently rinsed and dried, thus completing the planar type power MOSFET cell, according to the third embodiment of the present invention shown in FIG. 12.

<Effect>

The thus prepared planar type power MOSFET cell according to the third embodiment of the present invention has the MIS structure including the ONO gate insulating films 9a, 9b, showing transistor characteristic more excellent than that of the planar type power MOSFET cell having an ordinary simple SiC thermally-oxidized gate oxide film.

Part of the MIS structure including the ONO gate insulating films 9a, 9b according to the third embodiment showed as high TDDB lifetime distribution (refer to FIG. 7) as that according to the first embodiment. Namely, the MIS structure planar type power MOSFET cell including the ONO gate insulating films 9a, 9b and the production method therefor according to the third embodiment of the present invention have solved the following first problem of the conventional planar type power MOSFET of the conventional technology (non-patent document 5):

The TDDB lifetime of the ONO gate insulating film is greatly improved to such an extent as to reach that of the Si thermally-oxidized film, but the ONO gate insulating film is not necessarily sufficient for a long time operation at a temperature higher than a practical upper limit temperature of the Si (MOS) device.

In addition, according to the third embodiment of the present invention, through any of the operation (c3) and the operation (c4), the oxide silicon films 10a, 10b are formed by an operation other than the thermal oxidizing of the SiC. Namely, the third embodiment of the present invention solves the following second problem of the conventional technology (non-patent document 5):

The ONO gate insulating film according to the conventional technology (non-patent document 5) is so structured as to form the first oxide silicon film (which contacts SiC) with the SiC thermally-oxidized film. Thereby, the high-reliability technology of the conventional gate insulating film cannot be applied to a specific MOS (MIS) structural device that is unable to use the SiC thermally-oxidized film due to structural restriction and the like of the device.

The third embodiment is extremely effective for producing the power UMOSFET having the ONO gate insulating film structure formed at the trench of the SiC substrate.

<<Fourth Embodiment>>

According to the third embodiment, the ONO gate insulating film structure of the present invention is applied to the planar type power MOSFET cell. The present invention is, however, not limited to the above. The ONO gate insulating film structure is also applicable to an IGBT (Insulated Gate Bipolar Transistor) cell having a like element structure, according to a fourth embodiment of the present invention. According to the fourth embodiment, substantially the same effect can be brought about as that brought about by the planar type power MOSFET cell according to the third embodiment.

The first embodiment to the fourth embodiment above are for a good understanding of the present invention, and therefore, not limiting the present invention. Therefore, the elements disclosed in the above four embodiments may include all design changes or equivalent thereof within the technical range of the present invention.

Moreover, the claimed structural elements are to be set forth relative to the structural elements according to the embodiments. Specifically, the SiC epitaxial substrate 1 (the SiC substrate 100 and the epitaxial layer 200 in FIG. 12) according to the embodiments corresponds to the claimed silicon carbide substrate, the oxide silicon films 10, 10a, 10b according to the embodiments correspond to the claimed first oxide silicon film, the SiN films 11, 11a, 11b correspond to the claimed silicon nitride film, the SiN thermally-oxidized film 12 according to the embodiments corresponds to the claimed silicon nitride thermally-oxidized film, and the ONO gate insulating film 9 according to the embodiments corresponds to the claimed ONO insulating film.

This application is based on a prior Japanese Patent Application No. 2005-247175 (filed on Aug. 29, 2005 in Japan). The entire contents of the Japanese Patent Application No. 2005-247175 from which priority is claimed are incorporated herein by reference, in order to take some protection against translation errors or omitted portions.

The scope of the present invention is defined with reference to the following claims.

INDUSTRIAL APPLICABILITY

The present invention can provide a silicon carbide semiconductor device having an improved practical upper limit temperature and a production method for the device.

The invention claimed is:

1. A method for producing a silicon carbide semiconductor device,
the silicon carbide semiconductor device comprising:
   a silicon carbide substrate;
   a gate electrode made of polycrystalline silicon; and
   an ONO insulating film sandwiched between the silicon carbide substrate and the gate electrode to thereby form a gate structure, the ONO insulating film including the followings formed sequentially from the silicon carbide substrate:
   a first oxide silicon film (O),
   an SiN film (N), and
   an SiN thermally-oxidized film (O),
the method comprising forming the first oxide silicon film (O) by thermally oxidizing a surface of the silicon carbide substrate in an oxidized nitrogen (NOx) gas atmosphere.

2. The method for producing the silicon carbide semiconductor device as claimed in claim 1, wherein the oxidized nitrogen (NOx) gas atmosphere is formed by supplying any one of the following gases:
   i) $N_2O$ (nitrous oxide),
   ii) NO (nitrogen monoxide),
   iii) $NO_2$ (nitrogen dioxide),
   iv) a mixture of at least two of i) to iii),
   v) a diluted gas of any of i) to iii), and
   vi) a diluted gas of the mixture in iv).

3. The method for producing the silicon carbide semiconductor device as claimed in claim 1, wherein the thermal oxidization in the oxidized nitrogen (NOx) gas atmosphere is implemented in a temperature range of 1000° C. to 1400° C.

4. The method for producing the silicon carbide semiconductor device as claimed in claim 3, wherein the thermal oxidization in the oxidized nitrogen (NOx) gas atmosphere is implemented in the temperature range of 1100° C. to 1350° C.

5. The method for producing the silicon carbide semiconductor device as claimed in claim 1, wherein an operation after forming of the first oxide silicon film (O) is implemented at a temperature less than or equal to a temperature of the thermal oxidization in the oxidized nitrogen (NOx) gas atmosphere.

* * * * *